(12) United States Patent
Deguenther et al.

(10) Patent No.: US 9,341,953 B2
(45) Date of Patent: May 17, 2016

(54) MICROLITHOGRAPHIC ILLUMINATION SYSTEM

(71) Applicant: Carl Zeiss SMT GmbH, Oberkochen (DE)

(72) Inventors: Markus Deguenther, Aalen (DE); Michael Layh, Altusried (DE); Michael Gerhard, Aalen (DE); Bruno Thome, Aalen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 126 days.

(21) Appl. No.: 14/192,264

(22) Filed: Feb. 27, 2014

(65) Prior Publication Data
US 2014/0176930 A1 Jun. 26, 2014

Related U.S. Application Data

(63) Continuation of application No. 12/190,179, filed on Aug. 12, 2008, now Pat. No. 8,705,005, which is a continuation of application No. PCT/EP2007/001362, filed on Feb. 16, 2007.

(60) Provisional application No. 60/774,850, filed on Feb. 17, 2006, provisional application No. 60/823,296, filed on Aug. 23, 2006.

(30) Foreign Application Priority Data

Sep. 9, 2006 (DE) .......................... 10 2006 042 452
Dec. 28, 2006 (DE) .......................... 10 2006 061 711

(51) Int. Cl.
*G03B 27/54* (2006.01)
*G03F 7/20* (2006.01)

(52) U.S. Cl.
CPC ........ *G03F 7/70058* (2013.01); *G03F 7/70075* (2013.01); *G03F 7/70083* (2013.01); *G03F 7/70108* (2013.01); *G03F 7/70191* (2013.01)

(58) Field of Classification Search
CPC ............ G03F 7/70058; G03F 7/70075; G03F 7/70083; G03F 7/70108; G03F 7/70191
USPC .......................................................... 355/67
See application file for complete search history.

(56) References Cited

U.S. PATENT DOCUMENTS 4,655,555 A 4/1987 Maechler et al.
5,003,567 A 3/1991 Hawryluk et al.
(Continued)

FOREIGN PATENT DOCUMENTS

DE 33 43 868 6/1985
DE 41 24 311 1/1993
(Continued)

OTHER PUBLICATIONS
U.S. Appl. No. 60/774,850, filed Feb. 17, 2006.
(Continued)

*Primary Examiner* — Peter B Kim
(74) *Attorney, Agent, or Firm* — Fish & Richardson P.C.

(57) ABSTRACT

A microlithographic illumination system can include a light distribution device that can generate a two-dimensional intensity distribution in a first illumination plane. A first raster array of optical raster elements can generates a raster array of secondary light sources. A device with an additional optical effect can be disposed spatially adjacent to the two raster arrays. The device can be configured as an illumination angle variation device. The device can influence the intensity and/or the phase and/or the beam direction of the illumination light. The influence can be such that an intensity contribution of raster elements to the total illumination intensity can vary across the illumination field. This can enable the illumination intensity to be influenced across the illumination field in a defined manner with respect to the total illumination intensity and/or with respect to the intensity contributions from different directions of illumination.

25 Claims, 16 Drawing Sheets

(56) References Cited

U.S. PATENT DOCUMENTS

| | | |
|---|---|---|
| 5,212,588 A | 5/1993 | Viswanathan et al. |
| 5,343,489 A | 8/1994 | Wangler |
| 5,420,417 A | 5/1995 | Shiraishi |
| 5,461,456 A | 10/1995 | Michaloski |
| 5,581,605 A | 12/1996 | Murakami et al. |
| 5,615,047 A | 3/1997 | Komatsuda et al. |
| 5,686,728 A | 11/1997 | Shafer |
| 5,812,309 A | 9/1998 | Thoma et al. |
| 5,815,310 A | 9/1998 | Williamson |
| 6,033,079 A | 3/2000 | Hudyma |
| 6,069,739 A | 5/2000 | Borodovsky et al. |
| 6,195,201 B1 | 2/2001 | Koch et al. |
| 6,198,793 B1 | 3/2001 | Schultz et al. |
| 6,240,158 B1 | 5/2001 | Oshino |
| 6,244,717 B1 | 6/2001 | Dinger |
| 6,359,678 B1 | 3/2002 | Ota |
| 6,452,661 B1 | 9/2002 | Komatsuda |
| 6,512,641 B2 | 1/2003 | Omura |
| 6,549,270 B1 | 4/2003 | Ota |
| 6,658,084 B2 | 12/2003 | Singer |
| 6,710,917 B2 | 3/2004 | Mann et al. |
| 6,750,948 B2 | 6/2004 | Omura |
| 6,867,913 B2 | 3/2005 | Mann et al. |
| 6,894,834 B2 | 5/2005 | Mann et al. |
| 7,847,921 B2 | 12/2010 | Gruner et al. |
| 8,705,005 B2 | 4/2014 | Deguenther et al. |
| 2001/0038446 A1 | 11/2001 | Takahshi |
| 2001/0052969 A1 | 12/2001 | Von Bunau et al. |
| 2002/0136351 A1 | 9/2002 | Singer |
| 2002/0171048 A1 | 11/2002 | Braat |
| 2004/0070740 A1 | 4/2004 | Irie |
| 2004/0104359 A1* | 6/2004 | Komatsuda ......... G03F 7/70075 250/492.2 |
| 2004/0114217 A1 | 6/2004 | Mann et al. |
| 2004/0119961 A1 | 6/2004 | Singer et al. |
| 2004/0165282 A1 | 8/2004 | Sunaga et al. |
| 2004/0252358 A1 | 12/2004 | Kawahara et al. |
| 2005/0237623 A1 | 10/2005 | Fiolka et al. |
| 2006/0289956 A1* | 12/2006 | Boettiger ............... G01J 1/02 257/432 |
| 2007/0285644 A1 | 12/2007 | Brotsack et al. |
| 2008/0192359 A1 | 8/2008 | Sohmer et al. |
| 2009/0021715 A1 | 1/2009 | Deguenther et al. |
| 2009/0201481 A1 | 8/2009 | Gerhard |
| 2010/0103398 A1 | 4/2010 | Kita |
| 2011/0273791 A1 | 11/2011 | Mann et al. |

FOREIGN PATENT DOCUMENTS

| | | |
|---|---|---|
| DE | 195 20 563 | 12/1996 |
| DE | 198 12 803 | 10/1999 |
| EP | 1 069 448 A1 | 1/2001 |
| EP | 1 093 021 | 4/2001 |
| EP | 1 199 590 | 4/2002 |
| EP | 1 225 481 | 7/2002 |
| EP | 1 367 442 | 12/2003 |
| EP | 1 434 093 | 6/2004 |
| EP | 1 450 196 | 8/2004 |
| JP | 3-041328 | 2/1991 |
| JP | 11-110791 | 4/1999 |
| JP | 2001-185480 | 7/2001 |
| JP | 2003-114387 | 4/2003 |
| JP | 2004-093868 A | 3/2004 |
| TW | 476943 | 2/2002 |
| TW | 226938 | 1/2005 |
| WO | WO 03/029875 | 4/2003 |
| WO | WO 2004/010224 | 1/2004 |
| WO | WO 2005/078522 | 8/2005 |
| WO | WO 2005/083512 | 9/2005 |
| WO | WO 2006/084478 | 8/2006 |
| WO | WO 2008/080563 | 7/2008 |
| WO | WO 2008/126570 | 10/2008 |

OTHER PUBLICATIONS

Certified English Translation of U.S. Appl. No. 60/823,296, field Aug. 23, 2006.

Certified English Translation of Germany Patent Application No. 10 2006 042 452.2, filed on Sep. 9, 2006.

Bal, Matthieu Frédéric, dissertation "Next-Generation Extreme Ultraviolet Lithographic Projection Systems", Feb. 10, 2003.

R. Hudyma, "An Overview of Optical Systems for 30 nm Resolution Lithography at EUV Wavelengths," Proceedings of SPIE, vol. 4832, 2002, pp. 137-148.

European Search Report for EP Application No. 05 819 425.9-2217, dated Jun. 23, 2008.

English translation of Korean Office Action for corresponding KR Application No. 10-2010-7020467, dated Apr. 20, 2012.

Japanese Office Action, with English translation thereof, for corresponding JP Appl No. 2009-543391, dated May 2, 2013.

* cited by examiner

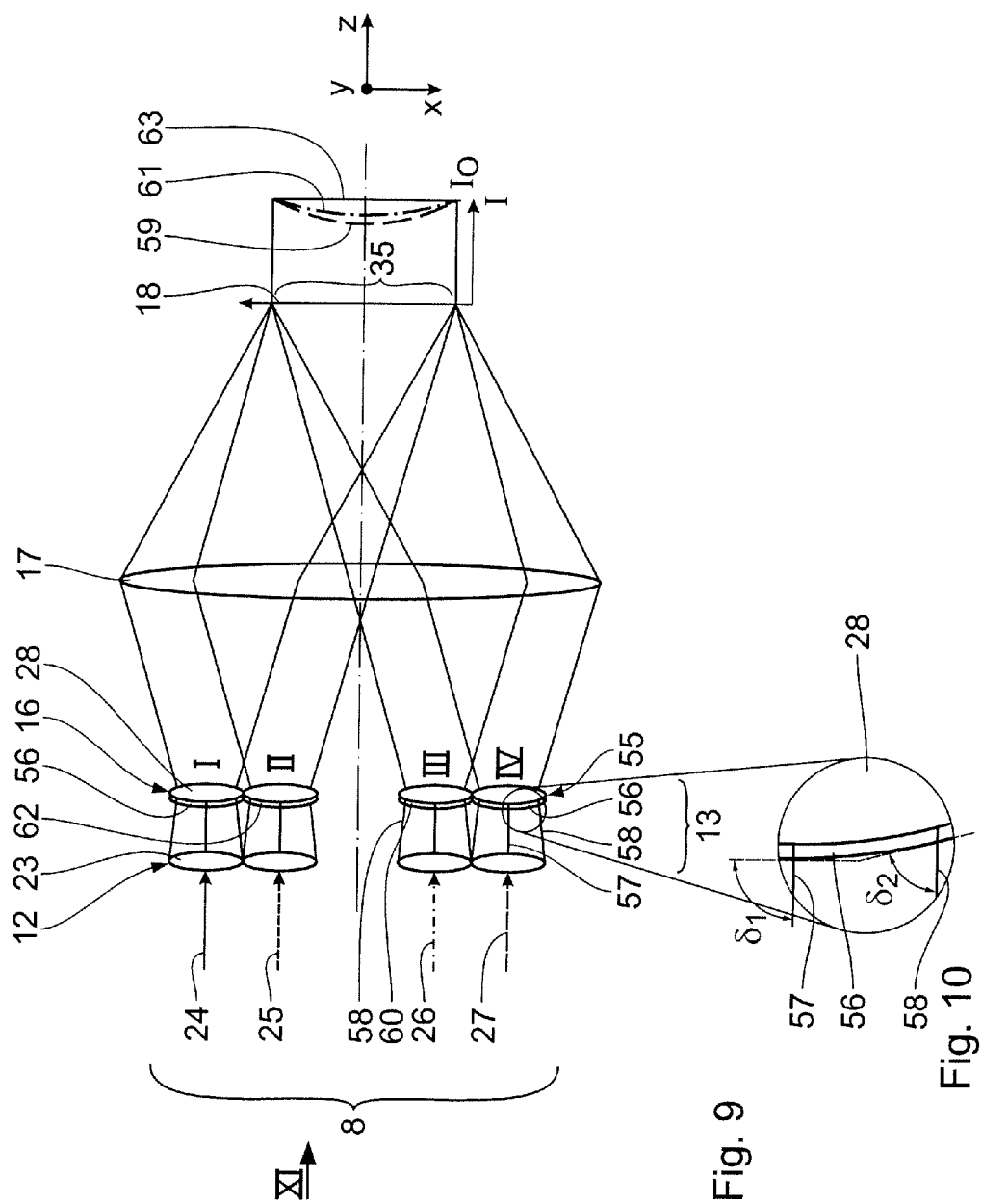

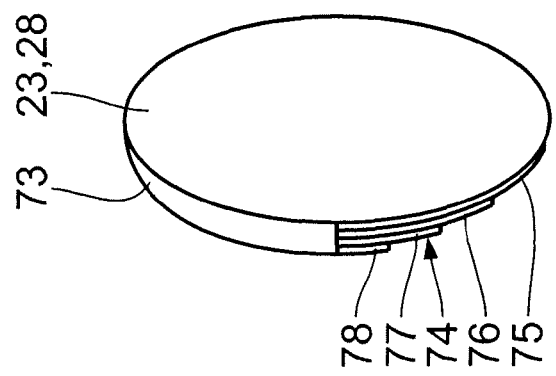
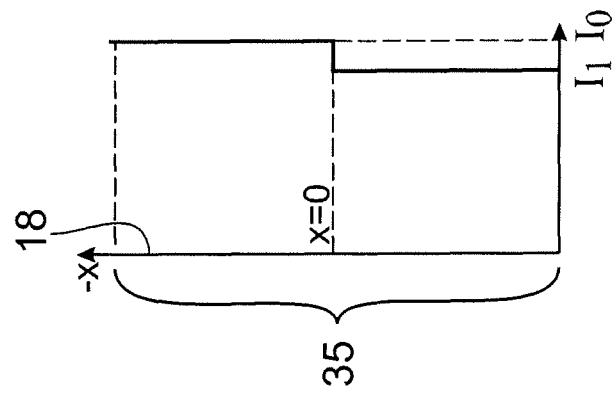
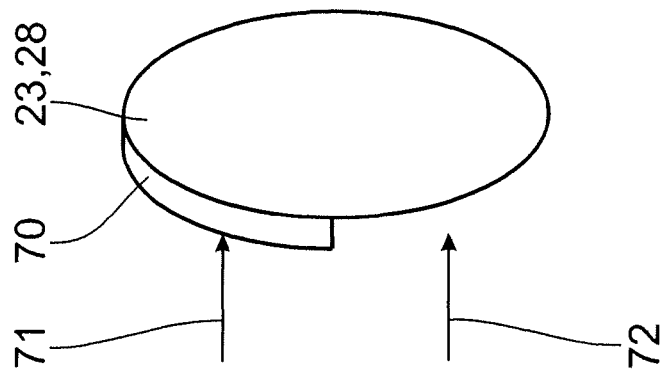

MICROLITHOGRAPHIC ILLUMINATION SYSTEM

CROSS-REFERENCE TO RELATED APPLICATIONS

This application is a continuation of, and claims priority under 35 USC 120 to, U.S. application Ser. No. 12/190,179, filed Aug. 12, 2008, which is a continuation of international application serial number PCT/EP2007/001362, filed Feb. 16, 2007, which claims benefit of U.S. Ser. No. 60/774,850, filed Feb. 17, 2006, U.S. Ser. No. 60/823,296, filed Aug. 23, 2006, German patent application serial number 10 2006 042 452.2, filed Sep. 9, 2006, and German patent application serial number 10 2006 061 711.8, filed Dec. 28, 2006. The full disclosures of international application serial number PCT/EP2007/001362 and U.S. application Ser. No. 12/190,179 are incorporated herein by reference.

FIELD

The disclosure relates to microlithographic illumination systems, as well as related microlithographic projection exposure apparatuses, components and methods.

BACKGROUND

In an illumination system, it is often desirable to influence the properties of illumination light across the illumination field in a defined manner.

SUMMARY

In some embodiments, the disclosure provides an illumination system designed so that the illumination intensity may be influenced throughout the illumination field in a defined manner with respect to the total illumination intensity and/or with respect to the intensity contributions coming from different directions of illumination.

The disclosure is based in part at least on the observation that a device with an additional optical effect, which is disposed in the vicinity of a first raster device for influencing the illumination light such that the intensity contribution of raster channels of the first raster array to the total illumination intensity varies across the illumination field, can provide additional degrees of freedom for generating the field-dependent optical effect of the illumination system. The device with the additional optical effect can allow correction or compensation of field-dependent optical effects of other components of the illumination system or even of the projection optics. The correctable or compensatable effects include for example transmission variations of optical components across the diameter thereof. Such transmission variations can for example be precompensated or overcompensated by the inventive device with the additional optical effect. In this manner, the illumination field or the object field of the illumination system may for example be illuminated such that all field points are exposed to light of virtually the same intensity from any desired direction of illumination, wherein intensity variations across the illumination angle are in the range of +/−1% for all field points. Serving as a reference value for the uniformity of illumination-angle exposure, it is conceivable to determine a relationship of intensities impinging upon field points from different directions or illumination angles, respectively. This relationship is also referred to as ellipticity. A possible way of influencing the beam direction by way of the device with the additional optical effect is in particular such that instead of influencing, i.e. deflecting, the entire beam direction of the entire illumination light beam in the same way, specific partial light beams of the illumination light are deflected, attenuated or phase-influenced in a defined manner while other partial light beams are not deflected, attenuated or phase-influenced at all or to different extents. A spatially adjacent positional relationship of the device with the additional optical effect relative to the first raster array can be ensured by the fact that the device with the additional optical effect is a component which is separate from the first raster array and is disposed in direct vicinity to the raster array. In certain embodiments of the illumination system, the spatially adjacent device with the additional optical effect may be in direct contact with the first or another raster array, for example in the form of a coating applied to at least one of the raster arrays. The raster elements of the first raster array and at least of another potential raster array can be refractive. The first raster array need not be formed on a substrate monolithically, i.e. as one piece. The first raster array may also be formed in two pieces, wherein the first raster lines are formed on a first substrate and the first raster columns are formed on a second substrate. Between these substrates, there may in particular a distance which is such that the device with the additional optical effect is disposed directly upstream of the first plane in which the two-dimensional intensity distribution of the illumination light is defined. This plane is in particular a pupil plane of the illumination system. The field dependence of the intensity contributions may then be used to systematically achieve desired increasing intensities for selected illumination angles at specific field points, an intensity increase of the total illumination intensity at specific field points or a combination of both. This may in particular serve to compensate for transmission losses with field-dependent effects occurring in the illumination or projection optics. The illumination system may include a light or radiation source adapted to an illumination optics of the illumination system; this is however not obligatory. The illumination system may therefore also include only optical components which are disposed downstream of an accordingly adapted separate light or radiation source.

In some embodiments, a light distribution device can provide a defined two-dimensional intensity distribution in the first plane. In certain embodiments of the illumination system, the light distribution device is referred to as pupil defining element (PDE). The light distribution device may be dispensed with if there is another way of setting a defined intensity distribution in the first plane or in a plane which is optically conjugated thereto. This is the case, for instance, if the defined intensity distribution is generated by the first raster array itself or is achieved by way of the combined optical effects of the first raster array and at least another potential raster array.

In certain embodiments, a second raster array is combined with the first raster array to form a raster module which in particular defines the shape and the illumination of the illumination field and is therefore referred to as field defining element (FDE). The second raster array may in particular be dispensed with if a defined decrease or increase of illumination intensity is desired in a portion of the illumination field which guides in a scanning direction along which the object is guided through the illumination field, or in a portion disposed downstream thereof. The first raster array may have a light-converging effect, wherein the second raster array may be disposed in a focal plane of the first raster array. This arrangement of the second raster array is not obligatory, however. Optionally, the second raster array may be disposed at a defined position outside the focal plane of the first raster array, thus enabling the raster elements of the second raster array to be exposed to expanded illumination light beams of the illumination light.

In some embodiments, an otherwise undesired illumination error, referred to as nonlinearity of refraction at large angles of incidence, is systematically used to influence the illumination light intensity distribution across the illumination field. Systematic deflection angles are defined via the angle variation portions of the illumination angle variation device, wherein paraxial approximation no longer applies, at least in relation to the maximum settable deflection angles, if refraction occurs at the raster elements of the first raster array. In general, this inevitably results in field-dependent intensity contributions of the raster elements which are impinged by deflection angles beyond the range of application of paraxial approximation.

In certain embodiments, the illumination angle variation device results in the abovementioned combination of field-dependent intensity distributions from defined directions of illumination and, at the same time, in a field-dependent total illumination intensity. Thus, several available degrees of freedom of the field-dependent intensity distribution can be used.

In some embodiments, the illumination angle variation device is aimed at a field-dependent total intensity distribution, wherein there is no illumination angle dependence of the intensity across the illumination field. This is in particular useful for loss compensation.

In certain embodiments, the illumination angle variation device has field-dependent intensity contributions from the different directions of illumination but shows no field dependence of the total illumination intensity. Thus, individual field points would each be exposed to light with the same amount of total intensity but from different principal directions. This can be useful for imaging structures with preferred directions which are distributed across the illumination field.

In some embodiments, illumination angle variation devices provide degrees of freedom which are adapted to the respective projection application in terms of the deflection angles that can be generated.

In certain embodiments, devices with additional optical effects may be fabricated by way of microoptical technologies. If the device with the additional optical effect is configured as a variation coating, the device may be fine-tuned, by way of ion beam figuring (IBF), with respect to its coating thickness distribution across the entire aperture of the raster module. A hybrid design of the illumination angle variation device is conceivable as well.

In some embodiments, the illumination angle variation device may be fabricated with high precision.

In certain embodiments, the illumination angle variation device is easily fabricated. The roof edge is thus either aligned parallel to the raster lines or to the raster columns of the first raster array.

In some embodiments, devices with additional optical effects can be fine-tuned to a desired field-dependent illumination intensity distribution.

In certain embodiments, a design of the illumination angle variation device can ensure that the first raster elements are exposed to deflected illumination light.

In some embodiments, wedge elements may be fabricated with a precisely defined wedge angle.

In certain embodiments, inverted roof-edge prisms lead to a field dependence of the illumination intensity which results in that the edges of the optical apertures are subject to an increased intensity. This may serve for compensation of near-edge losses in the illumination or projection optics, respectively.

In some embodiments, refracting cone surfaces result in a rotationally symmetrical field dependence of the intensity.

In certain embodiments, a constant deflection angle in an angle variation portion facilitates the design of the illumination angle variation device since the angle variation portions may be equipped with plane deflection surfaces. Optionally, it is conceivable for the angle variation portions to be equipped with spherical surfaces or other continuous surfaces, in particular freeform surfaces. The use of such non-plane angle variation portions may be advantageous in terms of fabrication.

In some embodiments, an illumination system reduces the requirements in terms of fabrication of the first raster array since the raster lines and the raster columns may be fabricated separately. Likewise, the second raster array may also be divided into a line array and a column array.

In certain embodiments, the arrangement of the device with the additional optical effect can be particularly effective in relation to the combined beam-guiding effect of the illumination angle variation device, the line array and the column array.

In some embodiments, to influence the illumination light, a variation coating may take advantage of the curvature of the incidence surface of the raster element to which the variation coating is applied. In this case, the variation coating may in particular be applied with a constant coating thickness. The transmittance of the variation coating across the point of incidence changes by way of different incidence angles of the illumination light in dependence on the point of incidence on the respective coated raster element, wherein the incidence angles are determined by the respective beam direction of the illumination light and by the curvature of the raster element at the point of incidence. A corresponding transmission of the variation coating is determined by the coating thickness of the variation coating which is effectively penetrated by the illumination light at its point of incidence, thus leading to the desired dependence on the point of incidence. Accordingly, a phase influence is conceivable as well.

In some embodiments, a point-of-incidence dependence of the coating results in an increase of marginal rays. Optionally, if this is desired for reasons of compensation or correction, the coating may also be configured such that the transmission of central rays hitting the respective raster elements his higher than with respect to the marginal rays. In this case, the central rays are intensified in relation to the marginal rays.

In certain embodiments, in a partial arrangement of the optical variation coating, the marginal rays are intensified by raster element channels which are based in edge areas of the raster module. Neglecting the influence of other optical components in the illumination system, the marginal rays of illumination light are more intense when seen from the perspective of object field points if the illumination light arrives at illumination angles differing from the vertical incidence by a considerable degree. This effect is particularly interesting for compensation or correction of optical properties of other components in the illumination system since other optical components often cause marginal rays to be suppressed in favor of other types of rays, in particular in the event of extreme illumination angles.

In some embodiments, a partial arrangement of optical variation coatings with different effects enables the image-field dependent effect of the entire optical variation coating to be increased, thus offering an increased number of correction possibilities.

In certain embodiments, a variation coating, whose effect is determined by the point of incidence on the respective raster elements, is active only at positions where correction or compensation is desired.

In some embodiments an optical variation coating enables a smooth transition to be achieved between portions with coatings of different optical effects, which generally correspond to the effects to be compensated or corrected.

In certain embodiments, a variation coating takes advantage of the fact that the illumination light is generally subject to reflection losses when hitting uncoated raster elements. The partial coating can ensure that the illumination light is subject to a lower amount of loss in the coated areas, which may be useful to define intensity contributions that vary across the illumination field.

In some embodiments, a variation coating takes advantage of the dependence of transmission on coating thickness and/or layer sequence. The design parameters "coating thickness variation" and "layer sequence variation" may also serve to define intensity contributions that vary across the illumination field in an even more complex manner.

In certain embodiments, an optical device configured as a form variation takes advantage of the illumination-light refraction which is determined by the point of incidence on the raster elements and, consequently, of the variation of deflection angle distribution in order to define an intensity contribution that varies across the illumination field. The form variation is usually static, which means it is not actively defined via actuators.

In some embodiments, via form variations configured as freeform surfaces, intensity contributions of the raster elements having such form variations may be implemented even such as to vary across the illumination field in a complex manner.

In certain embodiments, a form variation leads to an intensity contribution of the raster element including the form variation, wherein the intensity contribution shows a corresponding symmetry across the illumination field.

In some embodiments, an intensity variation device including variation filter elements takes advantage of an attenuation, which is dependent on the point of incidence on the respective raster element, for defining a corresponding intensity contribution, delivered by the raster elements which are equipped with the variation filter elements, across the illumination field. This even allows intensity contributions of the raster elements to be obtained that vary in a complex manner. Variation filter elements are applicable which are fabricated with relatively low effort, such as variation filter elements in the form of gray wedges.

In certain embodiments, depending on the specific desired performance aspect of the illumination system, suitable variation filter elements include absorbing, reflecting or scattering variation filter elements.

In some embodiments, the attenuation of the variation filter element, in particular the course of the attenuation across the surface of the variation filter element, can be fine-tuned by way of incorporated particles.

In certain embodiments, metal particles, in particular chromium particles can be particularly suitable for the design of a variation filter element, especially in connection with UV illumination light.

In some embodiments, depending on the processing properties of the particles on the one hand and on those of the translucent carrier on the other, alternative settings are suitable for defining the desired course of attenuation of the variation filter elements.

In certain embodiments, a minimum diameter can avoid unwanted refraction effects caused by the particles.

In some embodiments, a minimum diameter is in particular suitable for UV illumination light.

In certain embodiments, variation filter elements can enable a high variation bandwidth to be achieved with respect to the illumination-field-dependent optical effect of the illumination system.

In some embodiments, the disclosure provides a microlithographic projection exposure apparatus including an illumination system as described herein.

In certain embodiments, the disclosure provides a microlithographic fabrication method that may be performed using a microlithographic projection exposure apparatus including an illumination system as described herein.

BRIEF DESCRIPTION OF THE DRAWINGS

Embodiments of the disclosure will hereinafter be described in more detail in conjunction with the drawings in which:

FIG. 9 shows a representation similar to FIG. 2 of a device with an additional optical effect in the form of a variation coating on the second stage of the raster array;

FIG. 10 shows an enlarged view of a detail according to FIG. 9 near the coating of a raster element of the raster array;

Figure 2:
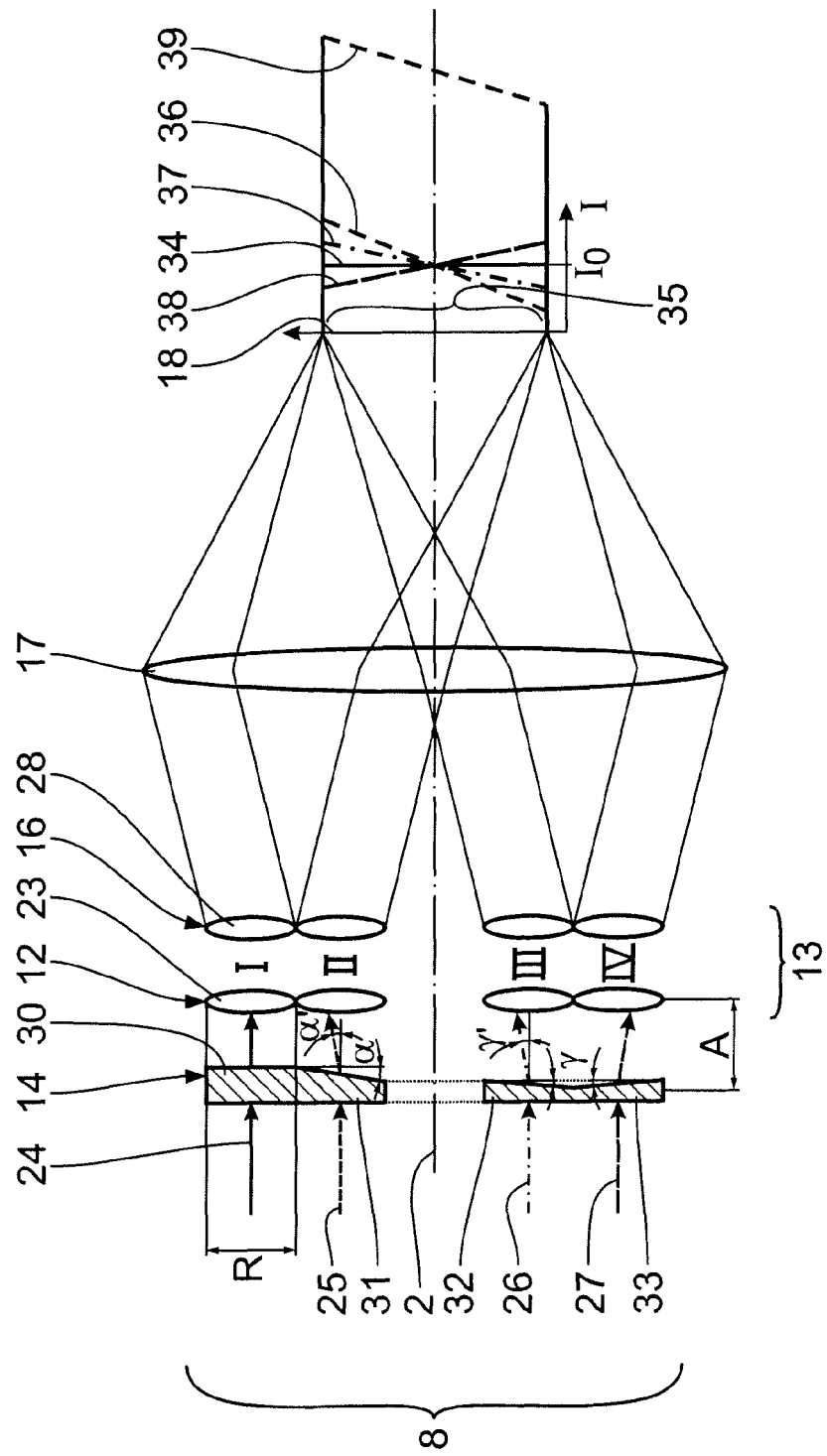
FIG. 2 shows a more detailed view of four channels of the two-stage raster array including the upstream illumination angle variation device and a downstream transmission optics for guiding the illumination light from the two-stage raster array into an illumination field as shown by the example of an intermediate field plane.
Figure 16:
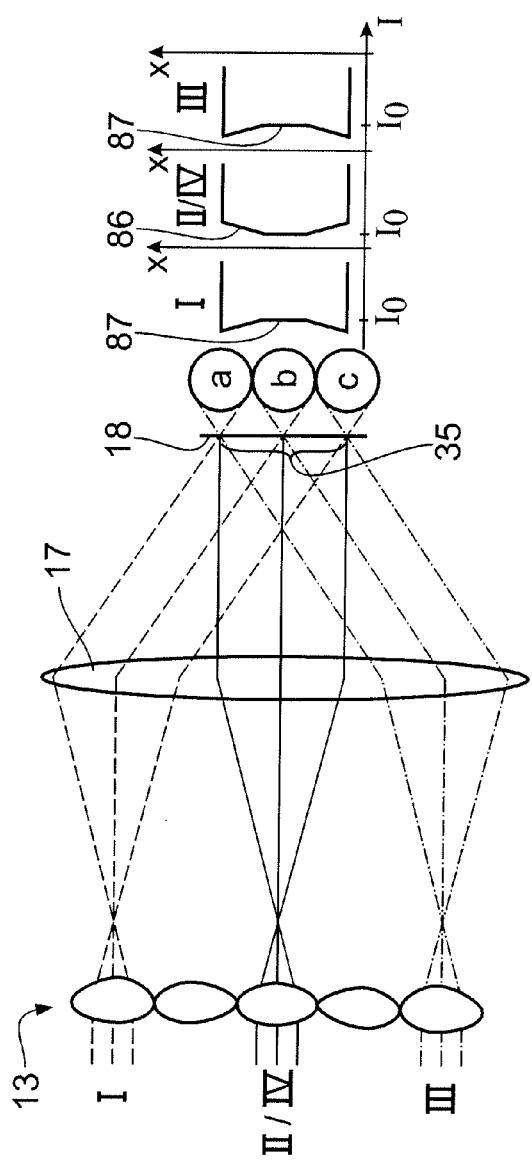
Figure 17:
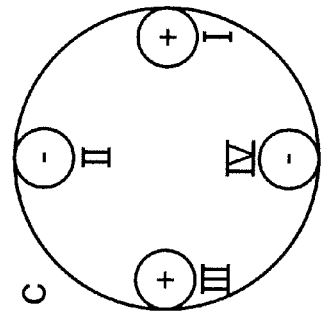
Figure 18:
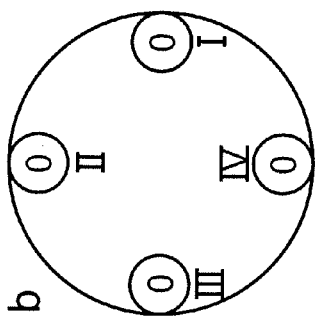
Figure 19:
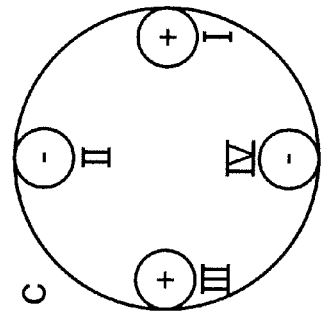
Figure 20:
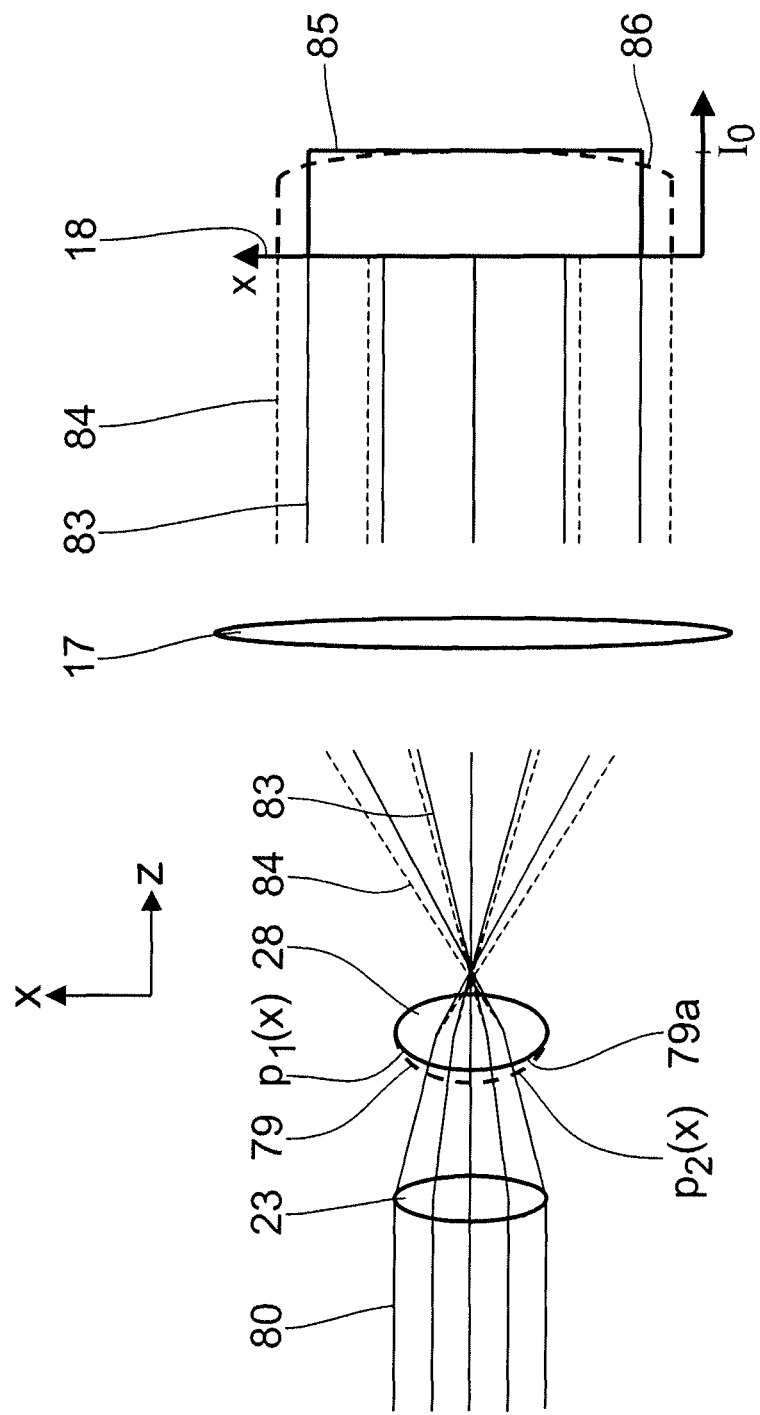
Figure 21:
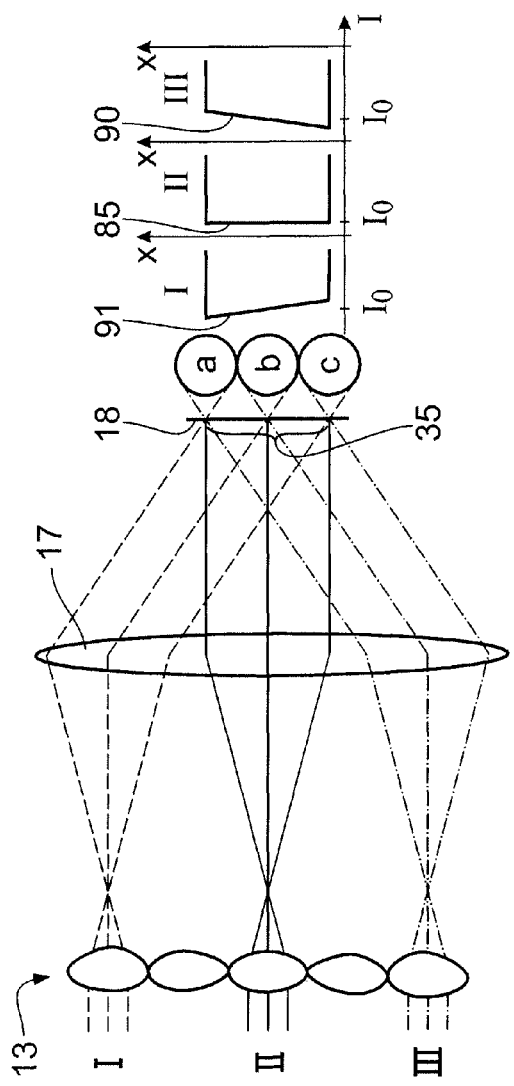
Figure 24:
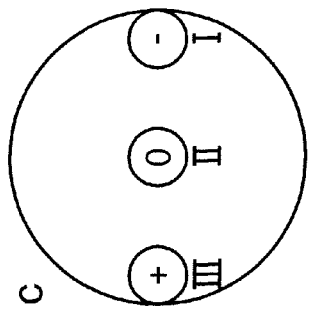
Figure 23:
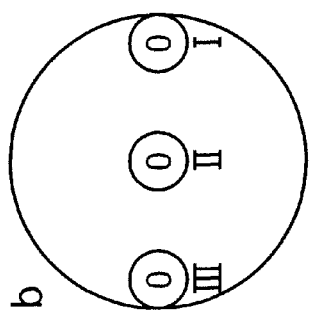
Figure 22:
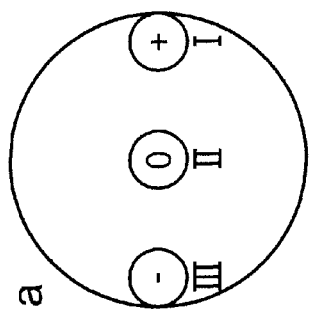
Figure 25:
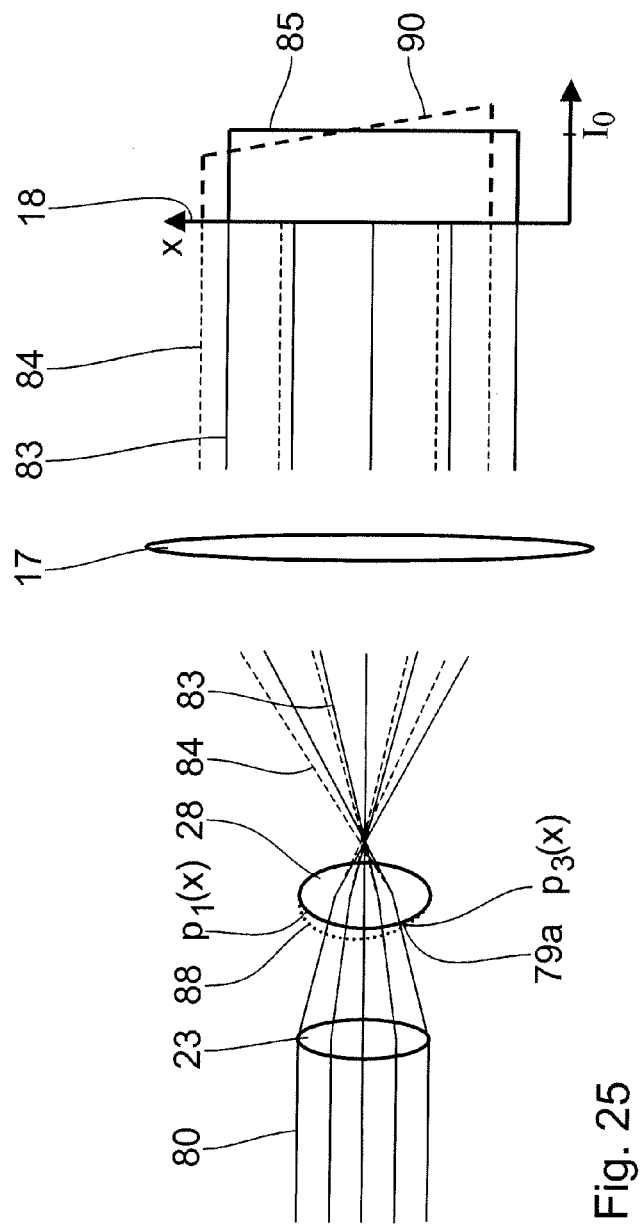
Figure 26:
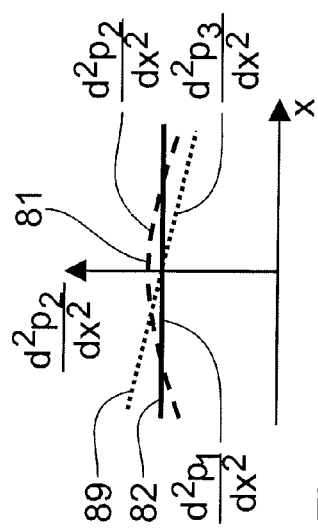
Figure 27:
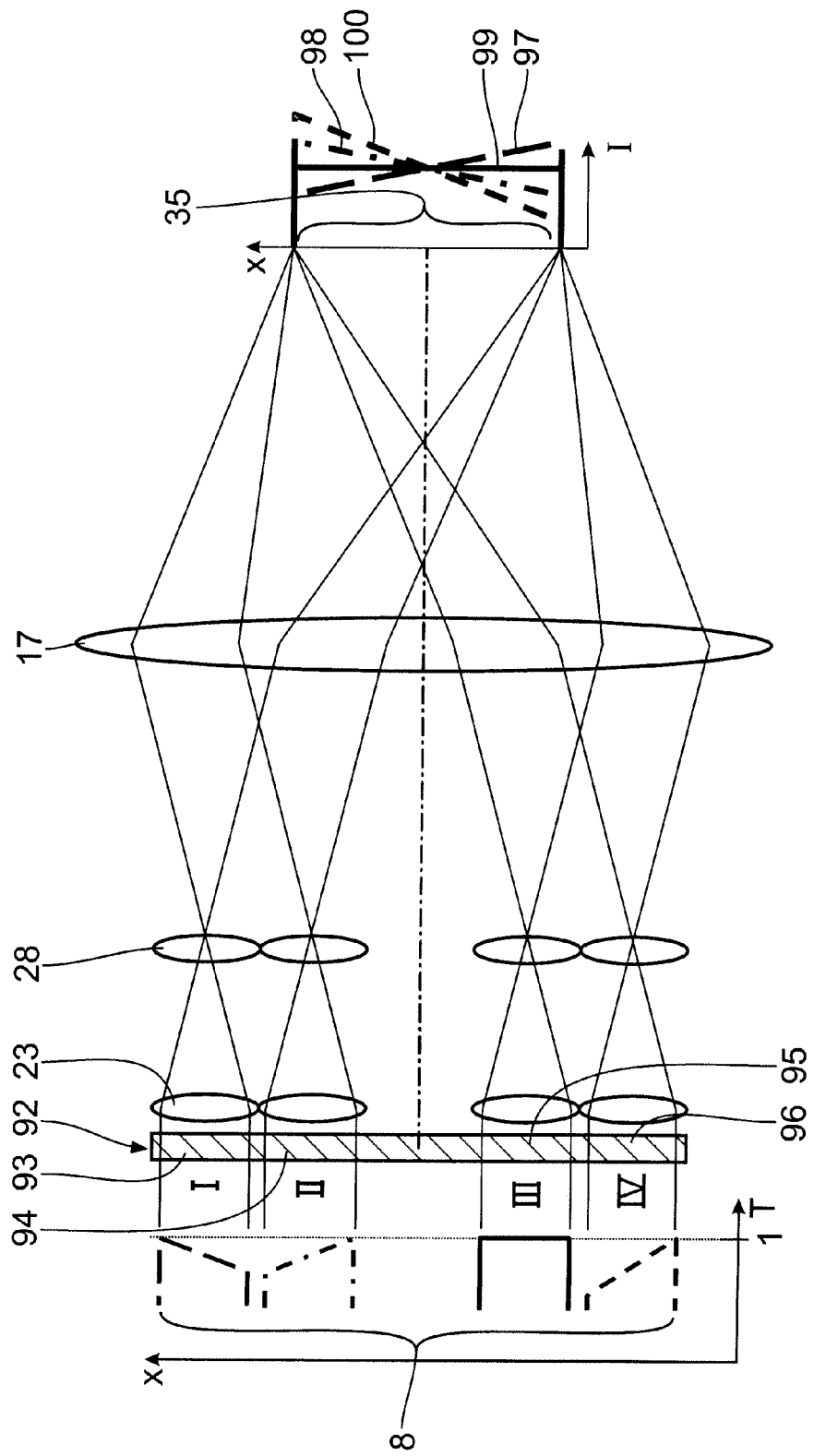
Figure 28:
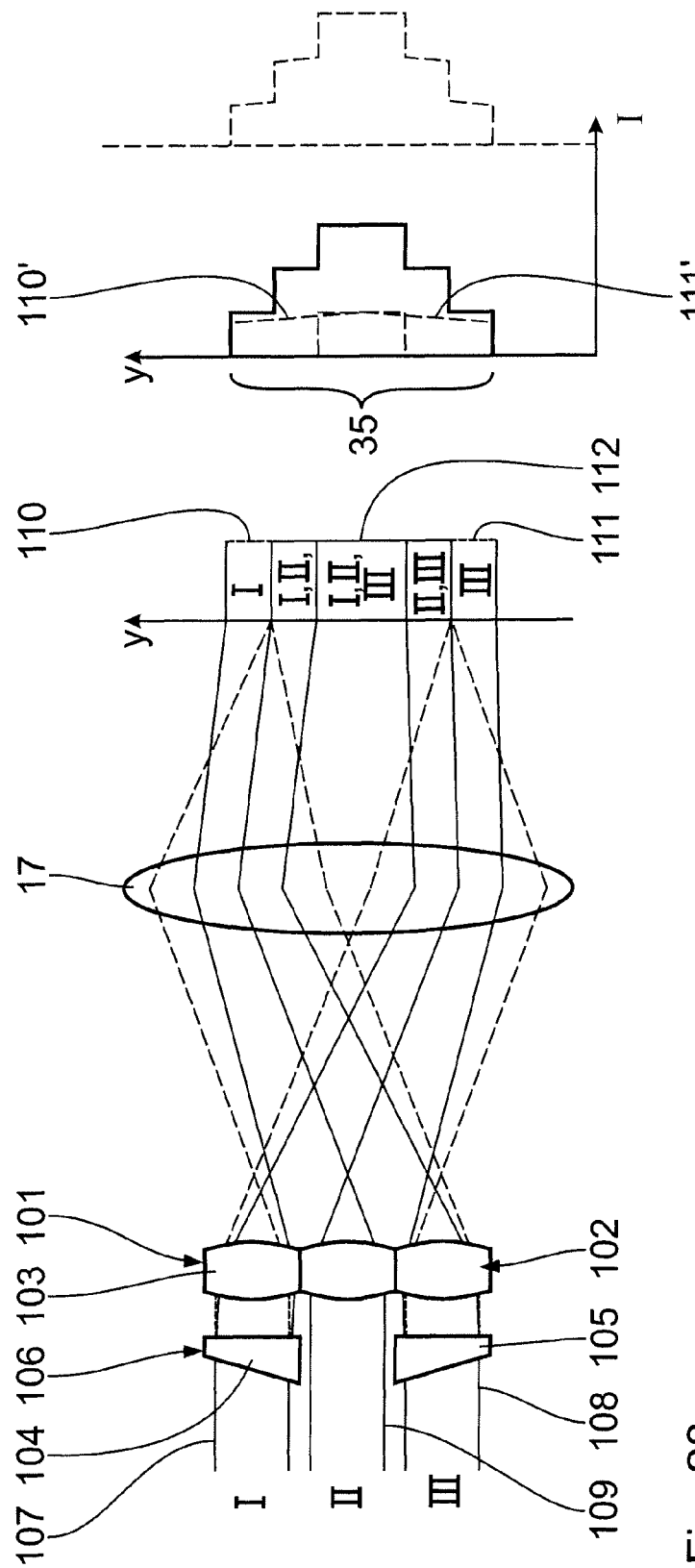

FIG. 13 shows an enlarged view of a raster element of the raster module including a device with an additional optical effect in the form of a coating;

FIG. 14 shows a partial representation similar to FIG. 2 of the effect exerted in the intermediate field plane by the raster element coated according to FIG. 13;

FIG. 15 shows a representation similar to FIG. 13 of two embodiments of a device with an additional optical effect in the form of a variation coating;

FIG. 16 shows a representation similar to FIG. 2 of the optical effect of a device with an additional optical effect which is configured as a form variation of at least one optically active surface of raster elements of the raster module;

FIG. 17 shows a schematic view of an intensity-dependent illumination angle distribution at the point a of the intermediate field plane according to FIG. 16;

FIG. 18 shows a schematic view of an intensity-dependent illumination angle distribution at the point b of the intermediate field plane according to FIG. 16;

FIG. 19 shows a schematic view of an intensity dependent illumination angle distribution at the point c of the intermediate field plane according to FIG. 16;

FIG. 20 shows a schematic view of an illumination channel according to FIG. 16 for generating a field-dependent intensity distribution which corresponds to that of channel I according to FIG. 16;

FIG. 21 shows a representation similar to FIG. 2 of the optical effect of a device with an additional optical effect which is configured as a form variation of at least one optically active surface of raster elements of the raster module;

FIG. 22 shows a schematic view of an intensity-dependent illumination angle distribution at the point a of the intermediate field plane according to FIG. 21;

FIG. 23 shows a schematic view of an intensity-dependent illumination angle distribution at the point b of the intermediate field plane according to FIG. 21;

FIG. 24 shows a schematic view of an intensity-dependent illumination angle distribution at the point c of the intermediate field plane according to FIG. 21;

FIG. 25 shows a schematic view of an illumination channel according to FIG. 21 for generating a field-dependent intensity distribution which corresponds to that of channel I according to FIG. 21;

FIG. 26 shows a schematic view of different form variations which are conceivable according to FIGS. 16 to 25;

FIG. 27 shows a representation similar to FIG. 2 of a device with an additional optical effect in the form of an intensity variation device including variation filter elements; and FIG. 28 shows a representation similar to FIG. 2 of a device with an additional optical effect in the form of an illumination angle variation device including a downstream single-stage raster array and transmission optics.

DETAILED DESCRIPTION

Figure 1:
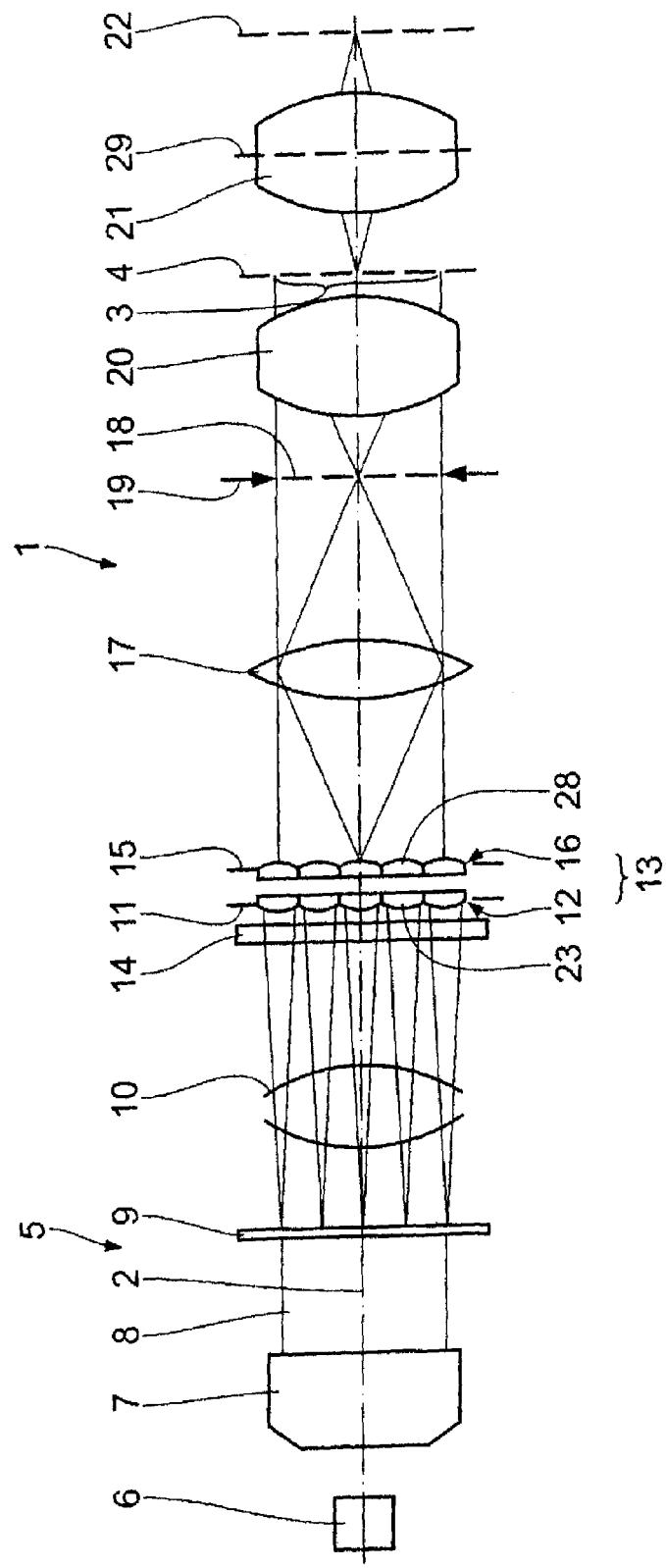
FIG. 1 shows a schematic meridional section through an inventive illumination system incorporated in a microlithographic projection exposure apparatus including a device with the additional optical effect, in the form of an illumination angle variation device, disposed upstream of a raster module including a two-stage raster array.

FIG. 1 shows a schematic view of a microlithographic projection exposure apparatus 1 which is configured as a wafer scanner and is used in the fabrication of semiconductor components and other finely structure components. In order to achieve resolutions up to fractions of micrometers, the projection exposure apparatus 1 uses light in particular from the vacuum ultraviolet range (VUV). A scanning direction of the projection exposure apparatus 1 extends perpendicularly to the drawing plane of FIGS. 1 and 2. In the meridional section of FIG. 1, all optical components of the projection exposure apparatus are disposed in succession along an optical axis 2. The optical axis may of course also be randomly folded, in particular to achieve a more compact design of the projection exposure apparatus 1.

An illumination system of the projection exposure apparatus 1, the whole of which is denoted by 5, serves for defined illumination of an object field or an image field 3, respectively, in a reticle plane 4 in which a structure to be transmitted is disposed in the form of a reticle which is not described in detail. An $F_2$ laser with a working wavelength range of 157 nm serves as primary light source 6, wherein the illumination light beam thereof is aligned coaxially with the optical axis 2. Other UV light sources such as an ArF excimer laser with a working wavelength range of 193 nm, a Krf excimer laser with a working wavelength range of 248 nm as well as primary light sources with higher or lower working wavelength ranges are conceivable as well.

Coming from the light source 6, the light beam has a small rectangular cross-section when initially hitting a beam expansion optics 7 which generates an exit beam 8 with substantially parallel light and a larger rectangular cross-section. The beam expansion optics 7 may contain elements for coherence reduction of the illumination light. After being substantially parallelized by the beam expansion optics 7, the laser light hits a diffractive optical element (DOE) 9 which is configured as a computer-generated hologram so as to generate an illumination-light angle distribution. When passing through a Fourier lens array or a condenser 10, respectively, which is disposed at a distance from the DOE 9 corresponding to its focal length, the angle distribution generated by the DOE 9 is transformed into a two-dimensional position-dependent illumination light intensity distribution which is thus perpendicular to the optical axis 2. The intensity distribution thus generated is therefore present in a first illumination plane 11 of the illumination system 5. Together with the condenser 10, the DOE 9 thus forms a light distribution device for generation of a two-dimensional illumination light intensity distribution.

Also referred to as a honeycomb condenser, a first raster array 12 of a raster module 13 is arranged in the vicinity of the first illumination plane 11. Together with an illumination angle variation device 14 disposed in the light path upstream thereof, the raster module 13 serves to generate a defined intensity and illumination angle distribution of the illumination light. The illumination angle variation device 14 is a first example of an optically active device which influences the intensity, the phase or the deflection angle of the illumination light beam 8. The optical effect of the illumination angle variation device 14 is hereinafter described in more detail by exemplary embodiments.

A second raster array 16 is disposed in another illumination plane 15, which is a Fourier-transformed plane relative to the illumination plane 11. The two raster arrays 12, 16 form the honeycomb condenser 13 of the illumination system 5. The other illumination plane 15 is a pupil plane of the illumination system 5.

Another condenser 17, also referred to as a field lens, is disposed downstream of the raster module 13. Together with the second raster array 16, the condenser 17 images the illumination plane 11 into an intermediate field plane 18 of the illumination system 5. A reticle masking system (REMA) 19 may be disposed in the intermediate field plane 18, thus serving as an adjustable shadow-forming stop for generation of a sharp edge of the illumination light intensity distribution. A downstream objective 20 images the intermediate field plane 18 onto the reticle, i.e. the lithography template, which is disposed in the reticle plane 4. A projection objective 21 serves to image the reticle plane 4 into a wafer plane 22 on a wafer (not shown in FIG. 1) which is displaced intermittently or continuously in the scanning direction.

An illumination angle variation device 14 is hereinafter described by FIGS. 2 to 4. The illumination angle variation device 14 is diffractive.

The first raster array 12 has individual first raster elements 23 which are arranged in columns and lines. The first raster elements 23 have a rectangular aperture with an x/y aspect ratio (y: scanning direction) of for example 2/1. Other, in particular higher aspect ratios of the first raster elements 23 are conceivable as well.

The meridional section according to FIG. 1 extends along a raster column. The first raster elements 23 are in particular configured as micro-lenses having a positive refractive power, for example. The rectangular shape of the first raster elements 23 corresponds to the rectangular shape of the illumination field 3. Filling substantially the entire available space, the first raster elements 23 are disposed directly adjacent to one another in a raster whose shape corresponds to the rectangular shape of the raster elements 23. The first raster elements 23 are also referred to as field honeycombs.

FIG. 2 shows four exemplary raster elements 23 which define channels I to IV (from top to bottom) for illumination light beams 24 to 27 of the illumination light 8. The illumination light beam 24 is assigned to channel I, the illumination light beam 25 to channel II, the illumination light beam 26 to channel III and the illumination light beam 27 to channel IV. The real raster module 13 includes a much higher number of channels, for example some hundreds of such channels. Assigned to respective channels, second raster elements 28 of the second raster array 16 are disposed in the light path downstream of the first raster elements 23 of the first raster array 12. The second raster elements 28 are also configured as micro-lenses with in particular positive refractive power. The second raster elements 28 are also referred to as pupil honeycombs which are disposed in the illumination plane 15, namely in a pupil plane of the illumination system 5. The illumination plane 15 is conjugated with a pupil plane 29 of the projection objective 21. Together with the field lens 17, the second raster elements 28 image the first raster elements 23, i.e. the field honeycombs which are disposed in the illumination plane 11, into the intermediate field plane 18, with the images of the first raster elements 23 being superimposed in the intermediate field plane 18.

The illumination angle variation device 14 disposed in the light path upstream of the first raster array 12 is divided into angle variation portions, wherein each angle variation portion is assigned to a channel of the raster module 13. An angle variation portion 30 is assigned to channel I, an angle variation portion 31 to channel II, an angle variation portion 32 to channel III and an angle variation portion 33 to channel IV. The vertical extension of each angle variation portion 30 to 33 relative to the optical axis 2 corresponds to the rectangular aperture of channels I to IV. Consequently, the illumination angle variation device 14 forms a raster array as well.

The raster of the illumination angle distribution device 14 of the angle variation portions 30 to 33 thus corresponds to the raster of the first raster array 12. Each angle variation portion 30 to 33 includes an aperture which corresponds to the aperture of the respectively assigned first raster element 23.

The angle variation portion 30 is configured as a coplanar raster element such as to prevent deflection of the incident illumination light beam 24. Provided that the entire aperture of channel I is exposed to an illumination light beam 24 of equal intensity, an intensity contribution 34 of the first channel I is obtained in the intermediate field plane 18 which has a constant value of $I_0$ across an illumination field 35 in the intermediate field plane 18.

Assigned to channel II, the angle variation portion 31 of the illumination angle distribution device 14 is configured as a wedge which, according to FIG. 2, tapers downwards with a first wedge angle $\alpha$ between an entrance surface and an exit surface. This causes the illumination light beam 25, which is guided parallel to the optical axis 2 upstream of the illumination angle variation device 14, to be deflected upwards by an angle $\alpha'$.

Figure 4:
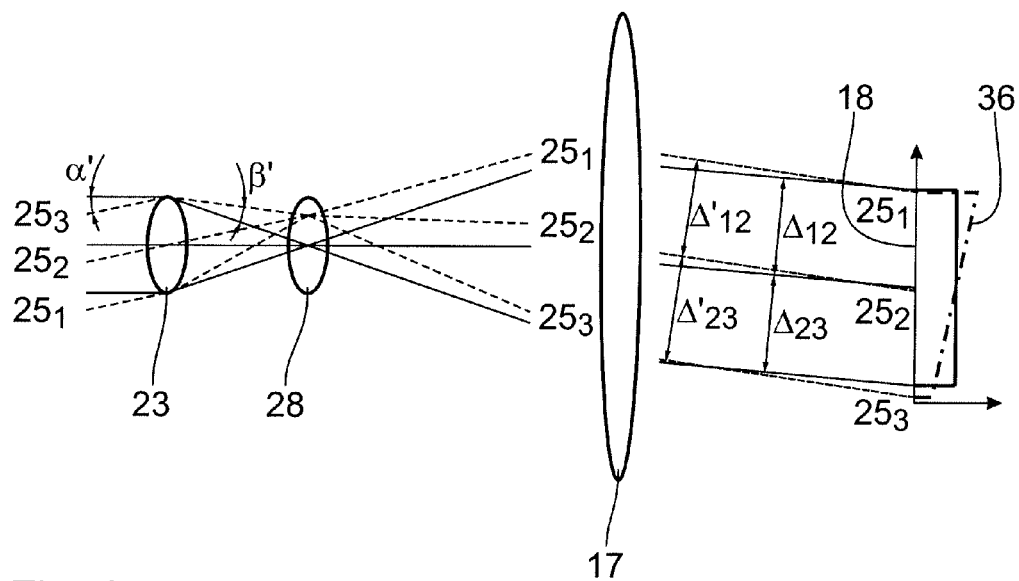
FIG. 4 shows a detailed view of individual beams being imaged by one of the channels of the two-stage raster array and the downstream transmission optics according to FIG. 2.

The deflection by the angle $\alpha'$ causes an intensity contribution 36 of channel II in the illumination field 35 to be affected in a certain way, which is now explained by FIG. 4. The illumination light beam 25 (shown dashed) is divided into three partial illumination beams $25_1$, $25_2$ and $25_3$ which are numbered from bottom to top on the entry side. Shown by a continuous line in FIG. 4, an illumination light beam is shown for comparison which is also divided into three partial illumination beams and is emitted into channel II parallel to the optical axis 2.

Due to the deflection angle $\alpha'$, the partial illumination beam $25_3$ is refracted to the greatest extent at the first raster element 23. When the partial illumination beam $25_3$ is refracted, paraxial approximation no longer applies. Compared to an aberration-free imaging process, the partial illumination beam 25 is refracted too strongly and is therefore deflected by an angle $\beta'$. The other two partial illumination beams $25_2$ and $25_1$ on the other hand are refracted to a relatively minor extent, with the result that paraxial approximation still applies in this case. When the incident partial illumination beams $25_1$ to $25_3$ are imaged by way of the second raster element 28 and the condenser 17, this aberration of refractive deflection of the partial illumination beam $25_3$ results in that downstream of the condenser 17, the distance $\Delta_{12}'$ between the partial illumination beams $25_1$ and $25_2$ is smaller than the distance $\Delta_{23}'$ between the partial illumination beams $25_2$ and $25_3$. In the intermediate field plane 18, this results in that the intensity contribution 36 of channel II is highest at the upper edge of the illumination field 35 according to FIG. 4 before decreasing linearly, i.e. with a constant amount of decrease, from a maximum intensity to a minimum intensity at the lower edge of the illumination field 35 according to FIG. 4. This linear course of the intensity contribution 36 of channel II remains the same even during the imaging process via the projection objective 21, provided that transmission losses of the optics are neglected.

Shown continuously for reasons of comparison, the partial illumination beams of paraxial incidence according to FIG. 4 have equal distances $\Delta_{12}$ and $\Delta_{23}$ between the partial illumination beams near the edge and the central partial illumination beam.

Assigned to channel III, the angle variation portion 32 of the illumination angle variation device 14 has a wedge angle $\gamma$ at the exit side which is smaller than the wedge angle $\alpha$. According to FIG. 2, the angle variation portion 32 tapers downwards in the shape of a wedge. This results in that a deflection angle $\gamma'$ of the illumination light beam 26 by way of the angle variation portion 32, is smaller than the deflection angle $\alpha'$ which is generated by the angle variation portion 31. Accordingly, there is a smaller difference in distance between the two partial illumination beams near the edge and the central partial illumination beam in channel III, with the result that an intensity contribution 37 of channel III is obtained which decreases across the illumination field 35 of FIG. 2 from top to bottom thereof with a smaller amount of decrease than the intensity contribution 36 of channel II.

The maximum intensity of the intensity contribution 37 at the upper edge of the illumination field 35 is lower than the maximum intensity of the intensity contribution 36. On the other hand, the minimum intensity of the intensity contribution 37 of channel III however exceeds the minimum intensity of the intensity contribution 36 of channel II.

The angle variation portion 33 of channel IV is configured as a wedge in FIG. 2 that tapers upwards with a wedge angle γ between entrance surface and exit surface, wherein the absolute value thereof corresponds to the wedge angle γ of the angle variation portion 32 of channel III. As a result, an intensity contribution 38 of channel IV is obtained which varies linearly across the illumination field and corresponds to the intensity contribution 37 when mirrored around the optical axis 2. In the example of the intensity contribution 38 of channel IV, the minimum intensity is thus present near the upper field edge of FIG. 2 while the maximum intensity is present near the lower field edge of FIG. 2. The minimum and maximum intensities of the intensity contributions 37 and 38 near the field edges have approximately equal absolute values.

Figure 3:
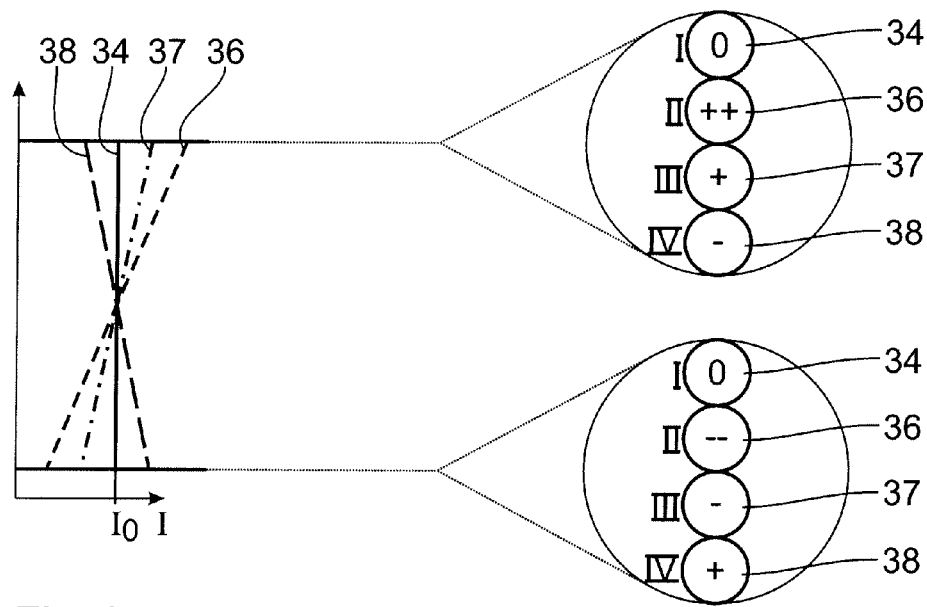
FIG. 3 shows a more detailed view of the illumination-field-dependent illumination angle intensity distributions which are generated in the illumination field by the four channels shown in FIG. 2, and of the illumination contributions of these four channels by the example of two selected field points.

FIG. 3 illustrates the effect of the illumination angle distribution device 14 across the illumination field 35. The intensity contributions 34 and 36-38 of channels I-IV are again shown on the left-hand side of FIG. 3. The right-hand side of FIG. 3 shows a detailed representation of intensities of the individual intensity contributions 34 and 36-38 at selected field points near the upper edge of the illumination field 35 and near the lower edge of the illumination field 35.

An intensity contribution $I_0$ of channel I at the upper edge of the illumination field 35 is represented by "0". The intensity of the intensity contribution 36 reaches a maximum value at the upper edge of the illumination field 35, which is represented by "++". Likewise, the intensity of the intensity contribution 37 of channel III also reaches a maximum value at the upper field edge, wherein the maximum value is however smaller than the intensity of the intensity contribution 36 of channel II and is therefore represented by "+". The intensity of the intensity contribution 38 of channel IV is the lowest at the upper field edge, and is thus represented by "−".

The intensity composition from all possible directions of illumination of channels I-IV at the upper field edge is thus such that the contribution of channel II is the highest, followed by the intensity contribution of channel III and by the intensity contribution of channel I. The intensity contribution of channel IV is the lowest of all.

On the other hand, the relations at the lower field edge of the illumination field 35 are shown on the bottom right-hand side of FIG. 3. At this point, the intensity of the intensity contribution 34 of channel I also amounts to $I_0$ which is indicated by "0". At this point, the intensity of the intensity contribution 36 of channel II reaches its absolute minimum which is indicated by "−−". Likewise, the intensity of the intensity contribution 37 of channel III has an absolute minimum at the lower field edge. This minimum intensity of the intensity contribution 37 however exceeds the minimum intensity of the intensity contribution 36 so that the minimum intensity of channel II is therefore represented by "−" at the lower field edge. The intensity contribution 38 of channel IV has a maximum at the lower field edge, wherein the absolute value of the maximum corresponds to the maximum of the intensity contribution 37 at the upper field edge. The intensity contribution of channel IV at the lower field edge is thus represented by a "+".

Thus at the lower field edge of the illumination field 35, there is an intensity composition in which the intensity contribution 38 of channel IV is the highest, followed by the intensity contribution 34 of channel I, the intensity contribution 37 of channel III and the intensity contribution 36 of channel II.

The intensity compositions of the different intensity contributions from the possible directions of illumination, namely the channels I-IV, at the upper field edge differs from those at the lower field edge. Corresponding intensity compositions of the intensity contributions from the possible directions of illumination are achieved for field points between the upper and the lower edge of the illumination field 35. When the distance between the illumination field points and the edges of the illumination field 35 increases, this causes the differences of the intensity contributions 36, 37 and 38 to reduce with respect to the intensity $I_0$ of the intensity contribution 34. In the center between the edges of the illumination field 35, the level of intensity $I_0$ delivered by every channel I-IV to the total illumination intensity is the same for the respective field point.

All field points of the illumination field 35 are thus illuminated by channels I-IV but with different illumination contributions from the possible directions of illumination.

Along with the channels I-IV, other channels with different wedge angles may of course be provided as well. Since according to the representation of FIG. 2, the four channels I-IV include two angle variation portions which taper downwards, namely the angle variation portions 31 and 32, whereas only one angle variation portion, namely the angle variation portion 35, tapers upwards, this results in a field-dependent total intensity distribution of illumination angles as well. Shown dashed at 39 in FIG. 2, the total intensity distribution is obtained by superimposing the intensity distributions 34 and 36 to 38.

The distance A of the illumination angle variation device 14 from the first raster array 12 is smaller than the quotient of the first raster element's 12 raster width R and the maximum deflection angle α'. When the angle variation portions 30 to 33 are illuminated accordingly by the illumination light beams 24 to 27, this ensures that virtually the entire illumination light beam 24 to 27 reaches the assigned raster element 23 of the first raster array 12 although it is deflected by the illumination angle variation device 14.

Figure 5:
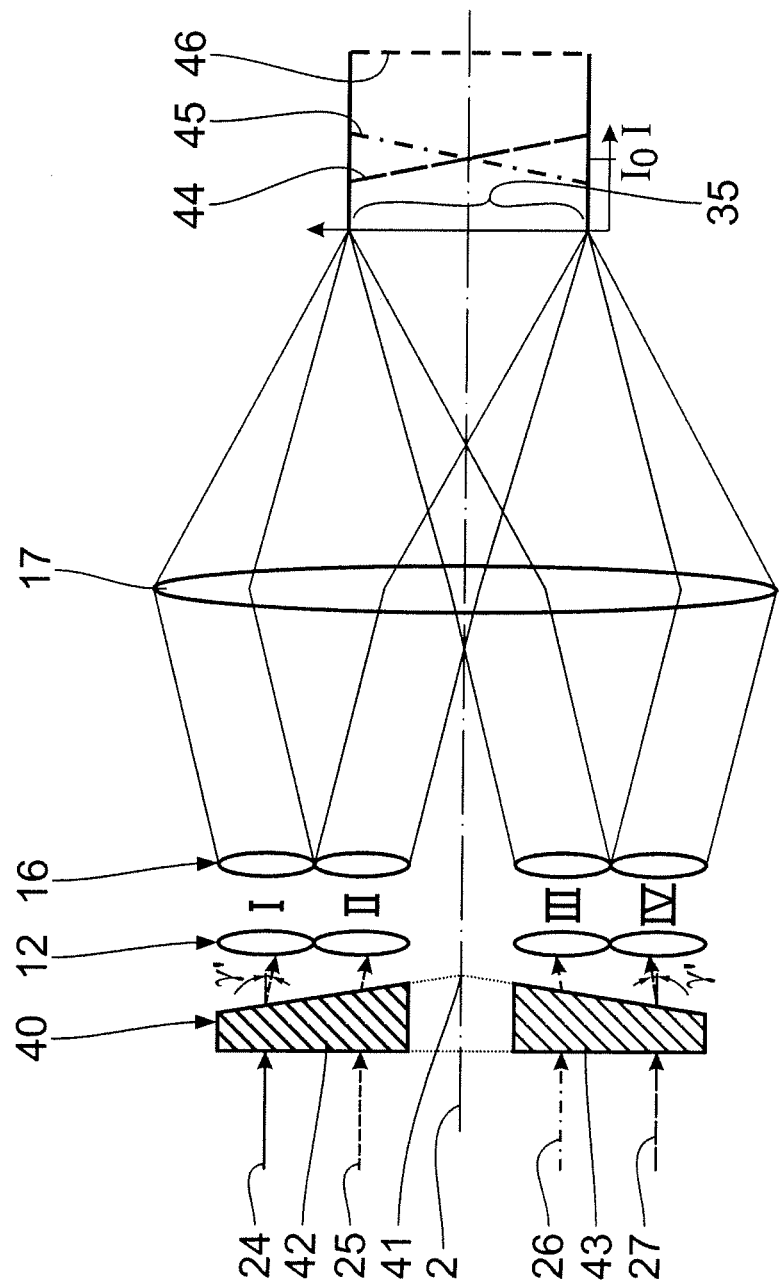
FIG. 5 shows a representation similar to FIG. 2 of an illumination angle variation device upstream of the two-stage raster array and the transmission optics.
Figure 6:
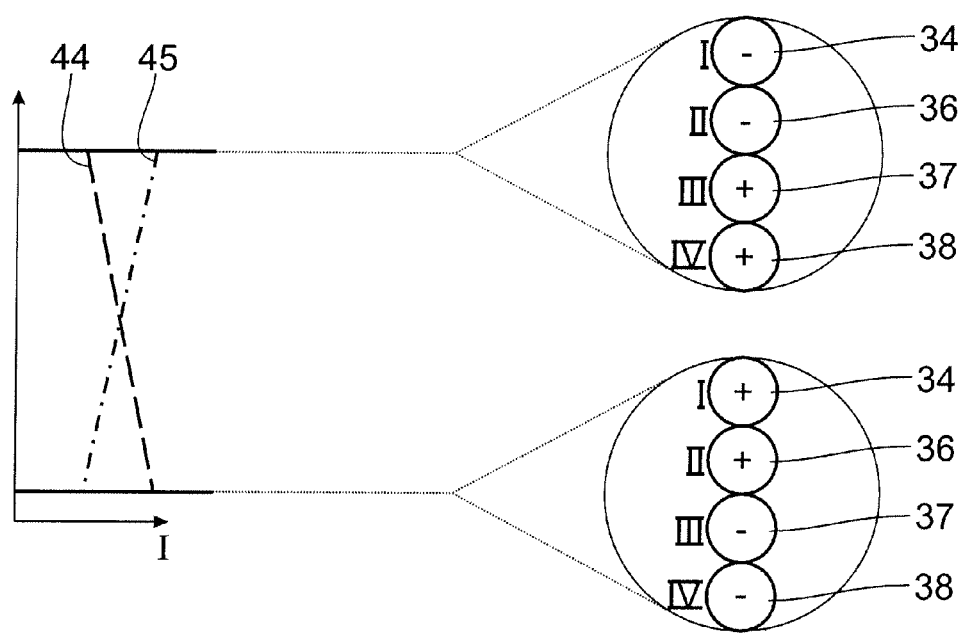
FIG. 6 shows a representation similar to FIG. 3 of the illumination-field-dependent intensity contributions which are generated in the different channels.

An illumination angle variation device which is applicable instead of the illumination angle variation device 14 is shown in FIGS. 5 and 6. Components which correspond to those described above in relation to FIGS. 2 to 4 are denoted by the same reference numerals and are not described in detail again.

The illumination angle variation device 40 is configured as a roof-edge prism including a roof edge 41 which intersects the optical axis 2 and is perpendicular to the drawing plane of FIG. 5. The illumination angle variation device 40 has only two angle variation portions 42, 43, namely an angle variation portion 42 tapering upwards in the shape of a wedge above the roof edge 41 of FIG. 5, and an angle variation portion 43 tapering downwards, also in the shape of a wedge, below the roof edge 41 of FIG. 5. This shape of the illumination angle variation device 40 results in a downward deflection, caused by the angle variation portion 42, of channels I and II by an angle γ', whereas the angle variation portion 43 causes channels III and IV to be deflected upwards by an angle γ'. The absolute value of this deflection angle γ' corresponds to the deflection angle γ' which is generated by the angle variation portions 32, 33 of the illumination angle variation device 14 according to FIG. 2.

Intensity contributions 44 of channels I and II are virtually identical, wherein their course across the illumination field 35 corresponds to the course of the intensity contribution 38 in FIG. 2. Intensity contributions of channels III and IV are virtually identical, wherein their course corresponds to that of the intensity contribution 37 in FIG. 2.

As shown in FIG. 6, the upper edge of the illumination field 35 is exposed to a minimum intensity delivered by channels I and II and to maximum intensity delivered by channels III and IV including the illumination angle variation device 40. Conversely, the lower edge of the illumination field 35 is exposed to a maximum intensity delivered by channels I and II and to a minimum intensity delivered by channels III and IV. Between the field edges, the intensity difference between the intensity contributions of channels I and II on the one hand and the intensity contributions between channels III and IV on the other hand reduces linearly until the intensities of all channels I to IV forming the total intensity have reached the same level in the center of the field.

Due to the equal absolute value of the edge angles γ' of the angle variation portions 42, 43, the absolute value of increase of the intensity contributions 44, 45 across the illumination field 35 remains constant as well. Provided that each of the channels I to IV transports equal light intensities in the illumination angle variation device 40, this results in a total intensity distribution 46 which remains constant across the entire illumination field 35 and is therefore field-independent. Different illumination field points are however also illuminated with different intensity contributions in the illumination angle variation device 40, wherein the intensity contributions correspond to the intensity contributions 44, 45 coming from the possible directions of illumination, namely from the directions of channels I to IV. When examining the total intensity distribution, it is found that the linear intensity contributions 44, 45 are inclined to different extents across the illumination field 35 and therefore cancel each other out, with the result that the total intensity distribution—unlike the angle distribution—is field-independent.

Instead of a roof-edge prism, the illumination angle variation device 14 may also be a refracting cone surface whose cross-section corresponds to that shown in FIG. 5. As a result, a course of intensity including intensity contributions 44, 45 is obtained in the direction perpendicular to the drawing plane of FIG. 5, the course of intensity corresponding to the representation of FIG. 5.

Angle variation portions with wedge angles corresponding to the angle variation portions 42, 43 may also be composed of wedge steps similar to a Fresnel lens such that the average total thickness of the illumination angle variation device remains constant in a plane perpendicular to the optical axis 2. This illumination angle variation device 40 has a raster which is composed of angle variation subportions with equal wedge angles across the angle variation portions 42, 43.

Figure 7:
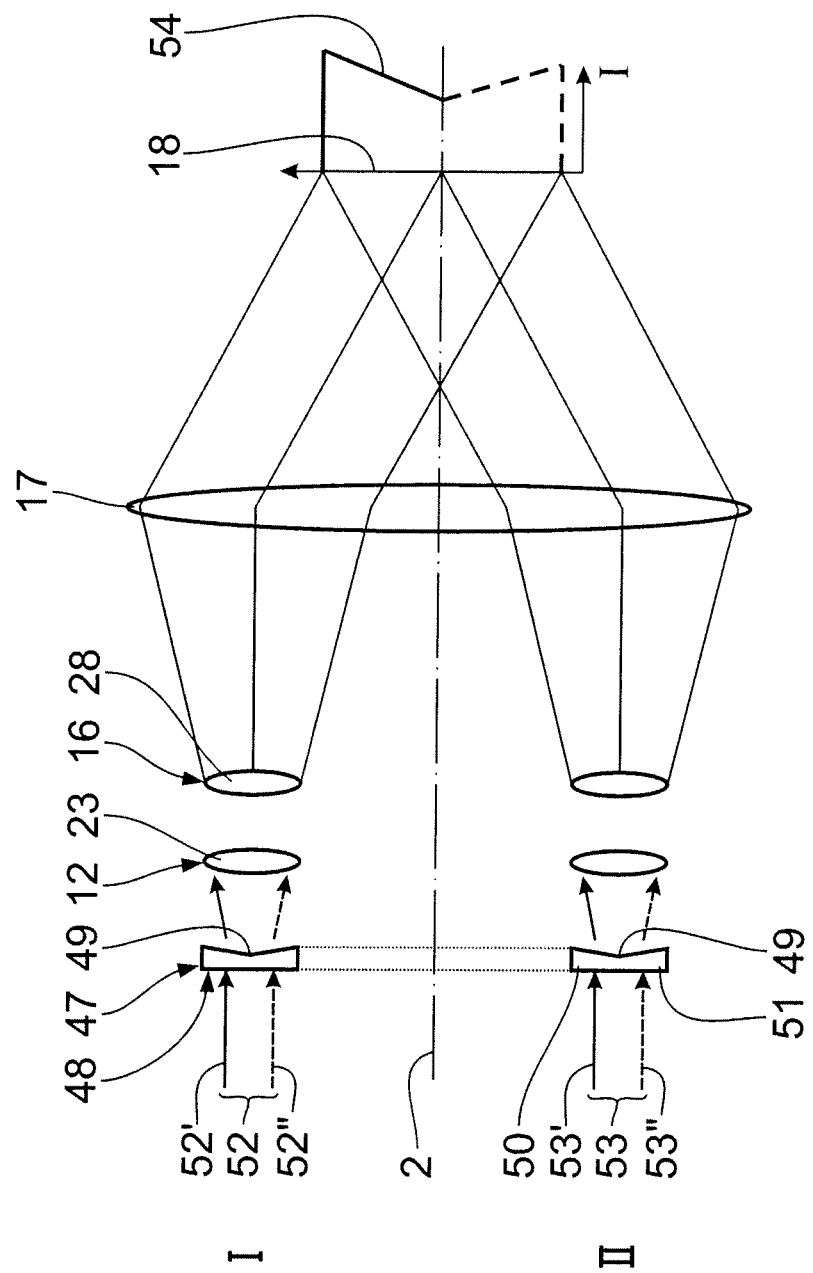
FIG. 7 shows a representation similar to FIG. 2 of another embodiment of an illumination angle variation device including a downstream two-stage raster array and transmission optics.

FIG. 7 shows a raster module including an illumination angle variation device 47 which is applicable instead of the illumination angle variation device 14. Components which correspond to those described above in relation to FIGS. 5 and 6 are denoted by the same reference numerals and are not described in detail again. The illumination angle variation device 47 is described by the example of an upper channel I and a lower channel II of the raster module 13.

The illumination angle variation device 47 is configured as a raster array of angle variation portions 48 whose raster corresponds to that of the first raster array 12. The aperture of the angle variation portion 48 therefore corresponds to the aperture of a first raster element 23. Each angle variation portion 48 is configured as an inverted roof-edge prism including a roof edge 49 which is disposed centrally in the exit surface between the edges of each angle variation portion 48 and is perpendicular to the drawing plane of FIG. 7. Above the roof edges 49 according to FIG. 7, a first angle variation subportion is formed which expands upwards in the shape of a wedge. Below each roof edge 49 according to FIG. 7, a second angle variation subportion 51 is formed which expands downwards in the shape of a wedge.

The angle variation portions 48 of channels I and II are impinged by illumination light beams 52, 53 which are divided in FIG. 7 into a continuous upper partial illumination beam 52', 53' and a dashed lower partial illumination beam 52", 53" for easier representation. The upper partial illumination beams 52', 53' are deflected upwards, by way of the first angle variation subportion 50, by an angle γ' while the lower partial illumination beams 52", 53" are deflected downwards, by way of the angle variation subportion 51, by an angle γ'. Each angle variation portion 48 delivers an intensity contribution 54 to the illumination intensity in the illumination field 35, wherein the intensity contribution 54 in each case shows the same dependence across the illumination field 35. Seen from the upper edge of the illumination field 35 towards the center thereof, this individual intensity contribution or the entire intensity distribution 54, respectively, which is generated by all angle variation portions 48 taken together, initially decreases linearly from a maximum to a minimum intensity before increasing linearly from the minimum to the maximum intensity until the lower edge of the illumination field 35 is reached. The intensity distribution thus has a shape which corresponds to the cross-section of one individual angle variation portion 48.

Correspondingly, an illumination-field-dependent total intensity distribution 54 is achieved in the illumination field 35, wherein different illumination field points are exposed to equal intensities from the possible directions of illumination since the contributions of all channels are the same.

Instead of angle variation portions configured as inverted roof-edge prisms according to FIG. 7, the angle variation portions may also be configured as raster elements with a refracting cone surface, wherein a rotational symmetry axis of the respective cone surface is parallel to the optical axis 2 or coincides therewith. Thus, a total intensity distribution is obtained which corresponds to the intensity distribution 54 but has a roof-edge dependence as well in the direction perpendicular to FIG. 7. The total intensity thus increases linearly from a minimum in the center of the illumination field 35 towards the edge thereof. Such an illumination angle variation device or the illumination angle variation device 47, respectively, allows transmission losses to be compensated at the aperture edges of the optics in the illumination system 5 or the illumination objective 21, respectively.

The illumination light intensity distributions generated by the illumination angle variation devices 14, 40 and 47 in the intermediate field plane 18 of the illumination field 35 are imaged into the illumination field 3 in the reticle plane 4 using the image scale of the objective 20.

In some embodiments, various features of the illumination angle variation devices may be refractive or hybrid ones.

Via the projection objective 21 of the projection exposure apparatus 1, at least a part of the reticle is imaged onto an area of a light-sensitive coating on the wafer or substrate, respectively, for microlithographic fabrication of a microstructured component.

Figure 8:
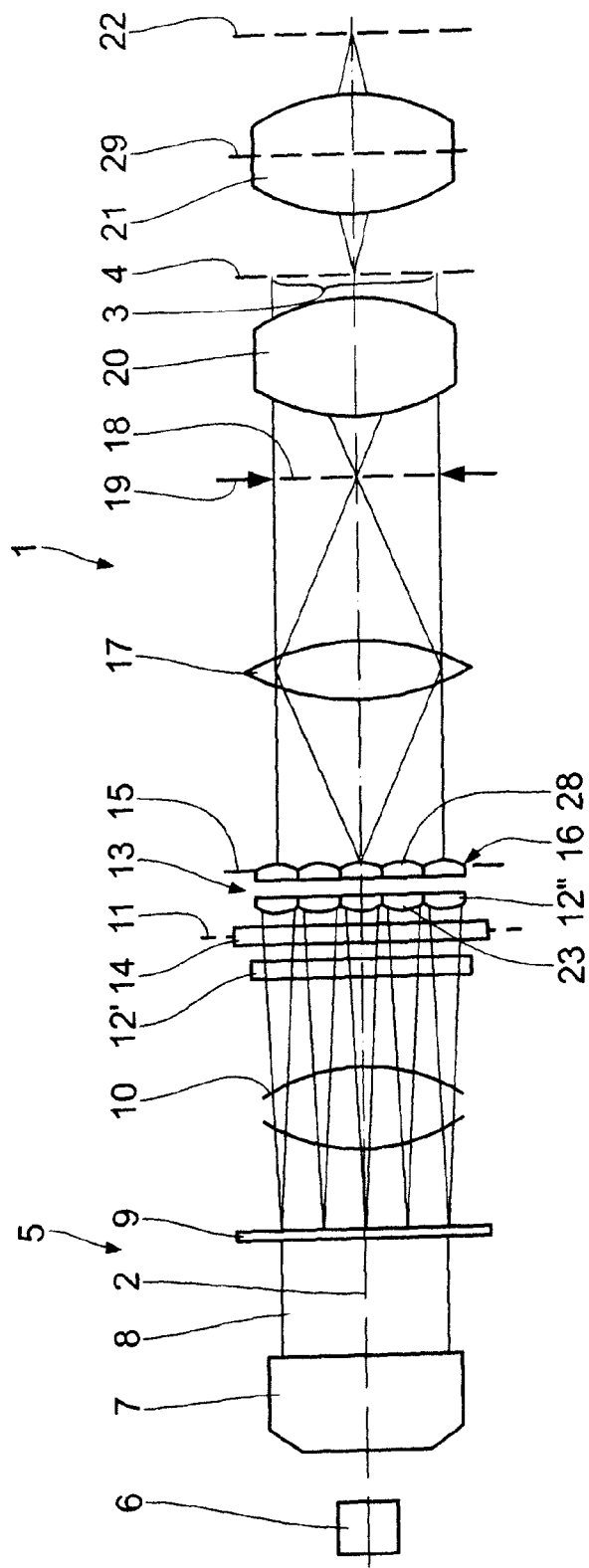
FIG. 8 shows a representation similar to FIG. 1 of an illumination system including the first stage of the raster array.

FIG. 8 shows the microlithographic projection exposure apparatus 1 which only differs from those according to FIG. 8 with regard to the configuration of the raster array 12 and with regard to the arrangement of the illumination angle variation device 14 relative to the raster array 12 and to the first illumination plane 11. In FIG. 8, the first raster array 12 is divided into a column array 12' including raster elements which form the first raster columns, and into a line array 12"

including raster elements which form the first raster lines. In contrast to the first raster array 12 according to FIG. 1, the raster array 12', 12" according to FIG. 8 is not monolithic but divided into two elements, wherein one element forms the raster lines and the other element forms the raster columns. The combined effect of the column array 12' and the line array 12" corresponds to the effect of the first raster array 12 according to FIG. 1.

In FIG. 8, the illumination angle variation device 14 is disposed between the column array 12' and the line array 12" in the vicinity of the first illumination plane 11. In FIG. 8, the column array 12' is disposed just upstream of the first illumination plane 11, while the illumination angle variation device is disposed in the illumination plane 11 and the line array 12" is disposed just downstream thereof. The distance between the column array 12' and the line array 12" relative to the illumination plane 11 is so small that it makes no difference to the optical effect of these two arrays 12', 12".

As an alternative to the arrangement according to FIG. 8, the positions of column array 12' and line array 12" may also be interchanged with one another.

In another alternative which is not shown in the drawing, the second raster array 16 is also divided into a line array and a column array.

FIG. 9 shows a raster module 13 including an optically active device for influencing intensity contributions delivered by the raster elements 23, 28 to the total illumination intensity across the illumination field 35. Components and reference values which correspond to those described above in relation to FIGS. 1 to 8 are denoted by the same reference numerals and are not described in detail again.

In FIGS. 9 to 12, an illumination angle variation device is equipped with an optically active device for influencing the properties of the illumination light beam 8, the optically active device being an optical variation coating 55 on the second raster elements 28 of the second raster array 16. The variation coating 55 is applied to the side of the second raster array 16 facing the first raster array 12. Each of the second raster elements 28 is provided with an individual transmission coating. The transmission coatings are interference coatings, for example. The thickness of the respective transmission coating may be fine-tuned by way of ion beam figuring (IBF). The effect of one of these transmission coatings, namely the transmission coating 56 of the second raster element 28 shown at the bottom of FIG. 9 (channel IV), is hereinafter described by way of the enlarged detail according to FIG. 10.

The illumination light beam 27 of channel IV is focused by the first raster element 23 of channel IV in the direction of the second raster element 28 of channel IV. A central ray 57 of the illumination light beam 27 is not deflected by the first raster element 23 and therefore hits the transmission coating 56 and the second raster element 28 perpendicularly. An angle $\delta_1$ between the central ray 57 and a tangent relative to the point of incidence of the central ray 57 hitting the transmission coating 56 therefore amounts to 90°.

Due to the curvature of the second raster element 28, an angle $\delta_2$ between a marginal ray 58 of the illumination light beam 27 and a tangent relative to the point of incidence of the marginal ray 58 hitting the transmission coating 56 is smaller than 90°. Consequently, the effective optical path of the central ray 57 passing through the transmission coating 56 is smaller than the effective path of the marginal ray 58 passing through the transmission coating 56. As a result, the transmission coating 56 shows a different transmittance for marginal rays of the illumination light beam 27 than for the central ray 57. A transmission of the illumination light beam 27 is therefore dependent on the point of incidence on the second raster element 28.

The transmission coating 56 has the same coating thickness across the entire second raster element 28. This uniformity of coating thickness across the respective second raster element 28 applies to the entire variation coating 55, wherein the coating thicknesses of the transmission coatings for the individual second raster elements 28 may differ from one another.

The thickness of the transmission coating 56 is chosen such that the transmission of transmission coating 56 is lower for the central ray 56 than for the marginal rays 58. An intensity contribution 59 of channel IV across the illumination field 35 in the intermediate field plane 18 is shown dashed in FIG. 9. The intensity contribution 59 is the smallest in the center of the illumination field 35. Towards the edge of the illumination field 35, the intensity contribution 59 increases continuously until the highest value $I_0$ is reached at the edge of the illumination field 35.

The effect of a transmission coating 60 on the second raster element 28 of channel III is represented by an intensity contribution 61 across the illumination field 35 of FIG. 9. The intensity contribution 60 is shown dot-dashed in FIG. 9. The transmission coating 60 of channel III has an effect which is dependent on the point of incidence on the second raster element 28 of channel III and corresponds to that of transmission coating 56. Compared to transmission coating 56, however, the transmission coating 60 attenuates the central ray of the illumination light beam 26 to a lesser extent, thus leading to a lower absolute variation of the intensity of intensity contribution 61. The marginal rays 58 of channel III are again able to pass through with an intensity $I_0$.

The effect of a transmission coating 62 on the second raster element 28 of channel II is represented in FIG. 9 by an intensity contribution 63 across the illumination field 35. The transmission coating 62 is configured such that the illumination light beam 25 is transmitted with the same intensity, irrespective of its point of incidence on the transmission coating 62. The intensity contribution 63 therefore amounts to $I_0$ in each case, irrespective of the point of incidence on the illumination field 35.

The second raster element 28 in channel I is again coated with a transmission coating 56 corresponding to the transmission coating 56 of channel IV. The illumination light beam 24 is influenced by the raster module 13 according to FIG. 9 to the same extent as the illumination light beam 27, with the result that the illumination light beam 24 also delivers an intensity contribution across the illumination field 35 which corresponds to the intensity contribution 59.

The differences in transmittance of the transmission coatings 56, 60 and 62 may be achieved by way of different coating thicknesses of the transmission coatings or by different materials used for these transmission coatings. Differences may however also be achieved by different material sequences used for these transmission coatings, which are usually composed of several layers.

Figure 11:
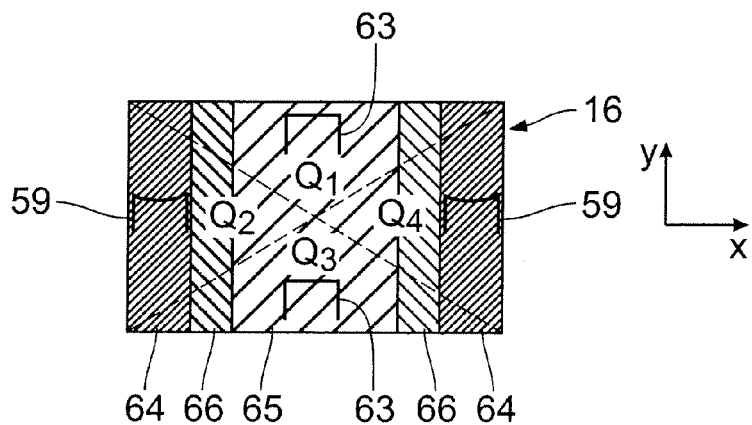
FIG. 11 shows a schematic view of the two-stage raster array according to FIG. 9 seen from the direction XI in FIG. 9.

FIG. 11 shows a schematic plan view of the second raster element 16 of the raster module 13 according to FIG. 9 including an exemplary distribution of raster elements 28 with the transmission coatings 56, 60, 62. Opposite edge strips 64 of the second raster array 16 are provided with second raster elements 28 which are each coated with transmission coatings having the same optical effect as the transmission coating 56 of channels I, IV according to FIG. 9. Each of the edge strips 64 has a plurality of second raster elements 28, namely a plurality of channels. The two edge strips 64 generate an intensity contribution across the illumination field 35 which corresponds to the intensity contribution 59 according to FIG. 9 multiplied with the number of channels in the edge strips 64, as indicated by FIG. 11. The two edge strips 64 extend along a scanning direction y of the projection exposure apparatus 1.

Extending between the two edge strips 64, a central strip 65 has second raster elements 28 whose transmission coatings have the same optical effect as the transmission coating 62 of channel II in FIG. 9. The central strip 65 is almost twice as wide as the edge strips 64. The central strip 65 delivers intensity contributions to the total intensity in the illumination field 35 which, when multiplied with the number of channels in the central strip 65, correspond the intensity contribution 63, as indicated by FIG. 11.

Another intermediate strip 66 is disposed between the central strip 65 and each of the two edge strips 64. The width of the intermediate strips 66, which also extend parallel to the scanning direction y, is smaller than the width of the edge strips 64. The two intermediate strips 66 are designed using second raster elements 28 whose transmission coatings have the same optical effect as the transmission coating 60 of channel III according to FIG. 9. The second raster elements 28 of the intermediate strips 66 therefore deliver intensity contributions 61 to the intensity across the illumination field 35.

In the illumination field 35 and downstream thereof in the object field 3 in the reticle plane 4, the illumination light beams near the edge, i.e. for example the illumination light beams 24 and 27, lead to an intensity increase at the edges, thus allowing effects occurring in the illumination system 5 and/or in the projection objective 21 to be corrected or compensated.

Figure 12:
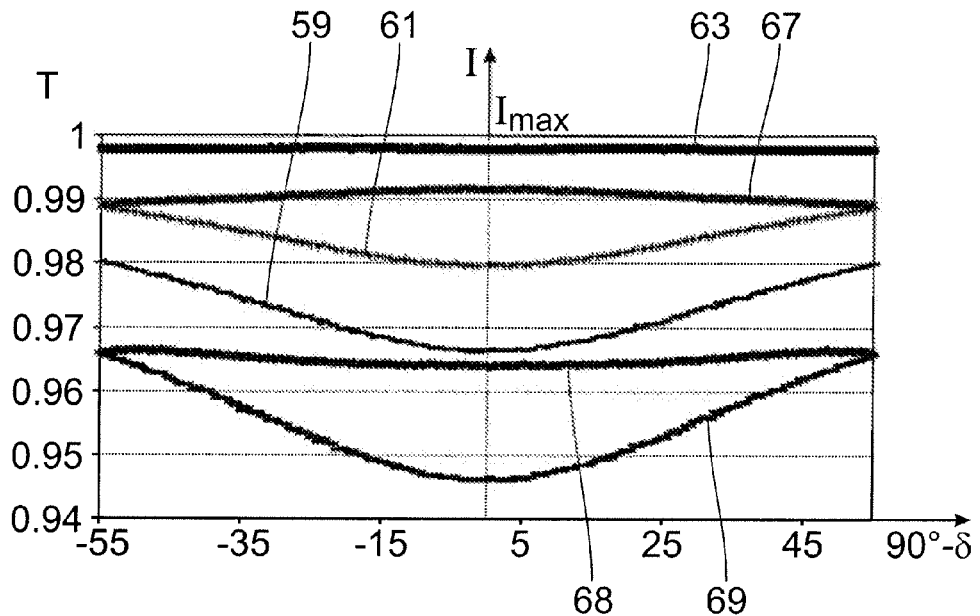
FIG. 12 shows, by way of a chart, how different thicknesses of a coating applied to a raster element according to FIG. 10 influence the transmission thereof, wherein the transmission is plotted against the angle of incidence on the coated optical surface of the raster element.

FIG. 12 shows the position- or angle-of-incidence-dependent intensity contribution in relation to different coating thicknesses of transmission coatings of the variation coating 55.

The transmission coating is composed of a material or a material sequence, respectively, which delivers an intensity contribution of $I_{max}=1$ at a coating thickness of the transmission coating of 75 nm. A transmission coating with a coating thickness of 75 nm across the second raster element 28 may thus serve as a transmission coating 62 for the central strip 65.

The transmission coatings described below only differ from the transmission coating described above with respect to the coating thicknesses thereof.

A transmission coating with a uniform coating thickness of 82 nm results in an intensity contribution which corresponds to the intensity contribution 61 according to FIG. 9. With respect to the central ray 57, this 82 nm transmission coating results in a transmission of 0.98. With respect to the marginal rays 58, a transmission of 0.99 is achieved. The 82 nm transmission coating is applicable for the second raster elements 28 of the intermediate strips 66.

A transmission coating with a coating thickness of 85 nm results in an intensity contribution which corresponds to the intensity contribution 59 of FIG. 9. The transmission of the central ray 57 amounts to approximately 0.967. The transmission of the marginal rays 58 amounts to approximately 0.98. This 85 nm transmission coating is applicable for the two edge strips 64.

FIG. 12 further shows other promising coating thickness alternatives for transmission coatings of the variation coating 55. A transmission coating with the coating thickness 68 nm shows a transmission of approximately 0.992 with respect to the central ray 57 and a transmission of approximately 0.99 with respect to the marginal rays 58 (cf. intensity contribution 67). In this case, the transmission is higher for the central ray than for the marginal rays. This may also be useful to create an alternative second raster array in which transmission of the central rays in a central strip exceeds that of the marginal rays and in which both marginal and central rays are transmitted in equal measure in the marginal strips, or in which transmission of the central rays exceeds that of the marginal rays.

FIG. 12 further shows an intensity contribution 68 of a 61 nm coating. In this case, the transmission amounts to approximately 0.964 for the central ray and approximately 0.966 for the marginal rays.

In an 89 nm coating, the transmission amounts to approximately 0.946 for the central ray 57 and approximately 0.966 for the marginal rays 58. A combination of coatings with the intensity contributions 68 and 69 is therefore applicable for a raster element whose effect corresponds to that of the raster element according to FIG. 11, since the intensity contributions 68 and 69 of the marginal rays are virtually the same and show the greatest difference with respect to the central rays. The 61 nm coating with the intensity contribution 88 may for example be applied to the central strip 65 of the second raster array 16 while 89 nm transmission coatings with the intensity contributions 69 may be applied to the edge strips 64 thereof.

Instead of influencing the transmission by way of the different transmission coatings 56, 60, 62 of the variation coating 55, the variation coating 55 may also include correspondingly different phase coatings which generate different amounts of influence on the phases of the illumination light beams in the different channels of the raster module 13. Coatings with different phase-influencing effects may again be provided in portions of for example the second raster array 16, as described by the example of FIG. 11.

The variation coating 55 may also be applied to the first raster array 12. In this case, the variation coating 55 can be applied to the side of the first raster array facing the second raster array 16. Alternatively, it is conceivable to apply partial coatings of the variation coating to both the first raster array 12 and to the second raster array 16 whose optical effects of combine to generate the total effect of the variation coating 55.

Finally, it is conceivable to apply the variation coating 55 only to certain portions on the raster arrays 12, 16 of the raster module 13 so as to generate a defined point-of-incidence-depending optical effect, whereas no point-of-incidence depending effect shall be achieved in the uncoated portions.

Instead of dividing for example the second optical raster array 16 into five strips 64, 66, 65, 66, 64 with different optical effects, another division may be chosen as well. In particular in a direction perpendicular to the scanning direction y, i.e. in the x-direction, there may be chosen a continuously varying optical effect so as to achieve transitions between a central strip 65 and adjacent strips which provide for continuous instead of gradual optical effects on the illumination intensity across the illumination field. A division into for example two strips, three strips, four strips or into more than five strips is conceivable as well. The relative widths of the strips relative to one another may be different as well. Thus compared to the edge strips 64, 66, the central strip 65 may be narrower than in the example according to FIG. 11.

As a function of the x-coordinate, the illumination of each field point of the illumination field 3 may be described by a characteristic value E(x) which is a measure of illumination uniformity from different illumination angles. This value is a function of the intensities $I_Q$ when integrated over four quadrants $Q_1$ to $Q_4$ of the second raster array 16 and is defined as follows:

$$E(x)=((I_{Q1}(x)+I_{Q3}(x))/(I_{Q2}(x)+I_{Q4}(x))-1)\times 100\%.$$

The value E(x) is also referred to as ellipticity.

Described above, the device with the additional optical effect may be configured such that the ellipticity E(x) varies by less than +/−1% in the x-direction across the object field 3.

FIG. 13 shows a variation coating 70 on a raster element 23 or 28, respectively, of the raster module 13. The variation coating is only applied to one half of the entrance-side surface of the raster element 23, 28, with the result that a first partial beam 71 hitting the raster element 23, 28 passes through the variation coating 70. A second partial beam 72 of the illumination light 8 on the other hand hits the raster element 23, 28 in an uncoated area of the entrance-side surface. The variation coating is configured as an anti-reflection coating for the wavelength of the illumination light 8. According thereto, the first partial beam 71 passes through the variation coating 70 and the downstream entrance surface of the raster element 23, 28 virtually without losses whereas the second partial beam 72 is subject to a reflection loss of for example 4% of its light power.

The effect of the variation coating 70 across the illumination field 35 is illustrated by FIG. 14. From the center of the illumination field 35 (x=0) towards the top of FIG. 14, the illumination light beam 8 as well as the first partial beam 71 have passed through the variation coating 70, with the result that the illumination field is exposed to light with an intensity $I_0$ via the channel which is assigned to the raster element 23, 28 having the variation coating 70. Below x=0 in FIG. 14, the illumination field 35 is exposed to light beams of the illumination light 8 via the channel of the raster element 23, 28 having the variation coating 70, wherein the light beams are subject to reflection losses when passing through the uncoated portion of the entrance-side surface of the raster element 23, 28. Via this channel, the lower half of the illumination field 35 according to FIG. 14 is therefore exposed to light with an intensity $I_1$ to which approximately the following applies: $I_1=0.96\times I_0$. This simply configured variation coating 70 thus enables an intensity distribution to be generated that varies across the illumination field 35. The variation coating 70 may of course also be applied to the exit side of the raster elements 23, 28. Furthermore, the effects of variation coatings on the entrance and exit sides according to the variation coating 70 may combined to generate the field-dependent effect.

FIG. 15 shows two further alternative versions of variation coatings. A first one of the alternative versions, namely the variation coating 73, is shown on a raster element in the upper half of FIG. 15. The raster element may again be one of the raster elements 23 or 28, respectively. The variation coating 73 has a coating thickness that varies in dependence on the point of incidence on the raster element 23, 28. The coating thickness of the variation coating 73 is the highest in the center of the raster element 23, 28. The coating thickness of the variation coating decreases continuously towards the edges. Correspondingly, the transmission of the variation coating 73 for illumination light 8 also decreases from the center towards the edge. This transmission may increase or decrease from the center towards the edge. Furthermore, it is conceivable to design the coating thickness of the variation coating 73 such that the variation is the highest in an annular portion around the center of the raster element 23, 28, wherein the variation continuously decreases towards the center of the raster element 23, 28 on the one hand and towards the edge of the raster element 23, 28 on the other. Corresponding to this transmission variation, which is caused by the variation coating 73, a field-dependent intensity variation is achieved in accordance to the above description with respect to FIG. 9, for example, the intensity variation being caused by the channel assigned to this raster element 23, 28.

The lower half of FIG. 15 shows a variation coating 74. The variation coating has a layer sequence which varies in dependence on the point of incidence of the illumination light 8 on the raster element 23, 28. The variation coating 74 has a layer sequence with a first base layer 75 which covers the entire entrance surface of the raster element 23, 28. Applied to the base layer 75 is a first intermediate layer 76 which is not quite applied up to the edge of the raster element 23, 28 but leaves an annular portion near the edge of the raster element 23, 28 which is only covered by the base layer 75. The first intermediate layer 76 carries a second intermediate layer 77 which is again not applied up to the edge of the first intermediate layer 76 but leaves an annular portion of the raster element 23, 28 beyond the edge of the second intermediate layer 77, the annular portion only being coated with the base layer and the first intermediate layer 76. In a central portion of the raster element 23, 28, the second intermediate layer 77 carries a top layer 78. The top layer 78 is again not applied up to the edge of the second intermediate layer 77, with the result that beyond the edge of the top layer 78, there is an annular portion of the raster element 23, 28 which is covered by the base layer 75 and by the first and second intermediate layers 76, 77. The layers 75 to 78 have the same layer thickness. This layer thickness is adjusted to the wavelength of the illumination light 8 to ensure that depending on whether the illumination light 8 passes through one, two, three or four coatings 75 to 78 of the variation coating 74, the illumination light 8 is transmitted to different extents. Transmission may for example be the highest in the vicinity of the top layer 78 while decreasing in steps towards the region of the base layer 75. An exactly opposite course of transmission, which is the highest near the edges and the lowest in the central area of the top layer 78, is conceivable as well. Finally, the variation coating 74 also provides for a course of transmission in which the highest transmission is achieved in the vicinity of one of the intermediate layers 76, 77 for example and decreases both towards the edges and towards the center of the raster element 23, 28. The variation coating 74 includes a total of four individual layers 75 to 78. Another number of individual layers is conceivable as well. For example, two or three or more than four individual layers may be provided, such as 5, 10 or even considerably more individual layers such as 50 or 100 individual layers. As shown at the bottom of FIG. 15, the border in the edge region of the individual layers may be steplike. Alternatively, a continuous transition of the individual layers towards the base layer at the bottom may be provided in the edge region as well, thus resulting in a corresponding continuous transition with respect to the course of transmission. Depending on the design of the transitions, this provides for a steplike course of transmission, a steplike course of transmission with continuous transitions, or even for a substantially continuous course of transmission, provided there is a suitably high number of individual layers.

FIGS. 16 to 20 show the device with the additional optical effect which is in this case configured as a form variation 79 of the entrance surface of one of the second raster elements 28, namely as a form variation of one of the optically active surfaces of the raster module 13. Shown dashed in FIG. 20, the form variation 79 is a deviation from a basic form 79a. The basic form is hereinafter also referred to as $p_1$ (x). The form variation 79 is hereinafter also referred to as $p_2$ (x). The second raster elements 28 are not arranged in a focal plane of the first raster elements 23, as it is the case in FIG. 4, for example. The focal length of the first raster elements 23 is adjusted to the distance between the first raster elements 23 and the second raster elements 28 such that the second raster elements 28 are disposed on the side of the focal plane facing the first raster elements 23. As a result, an illumination light beam 80 impinging on the channel defined by the raster elements 23, 28 shown in FIG. 20 then forms a spatially expanded light beam when impinging on the surface of the raster element 28 having the form variation 79.

Depending on the point of incidence of the illumination light beam 80 on the raster element 28, the form variation 79 is configured such that the second derivative of the form variation 79 with respect to the space coordinates x and y results in an even function. This is illustrated in FIG. 26, by the example of the space coordinate x, in which an even function of such a second derivative 81 of the form variation 79 is shown dashed. For comparison, the second derivative 82 of the basic form 79a is also shown in FIG. 26, the second derivative 82 being constant.

A design of the form variation 79 by way of the second derivative 81 results in that due to the combined effect of the first raster element 23 and the second raster element 28, the illumination light beam 80 is expanded more near the edges than near the center of the illumination light beam 80.

This is illustrated by FIG. 20 in which continuous rays 83 of the illumination light beam 80 passing through the raster module having no form variation but the basic form 79a instead, are shown in comparison with dashed rays 84 passing through the raster module having the form variation 79. The rays 83 are expanded in a uniform manner such that the angle between adjacent rays hitting the raster module equidistantly remains the same in each case. As a result, a constant intensity contribution 85 of a channel having the basic form 79a is obtained, as shown on the right-hand side of FIG. 20.

Due to the channel having the form variation 79, the rays 84 near the edges are expanded to a greater extent, with the result that when seen across its cross-section downstream of the focal plane downstream of the second raster element 28, the illumination light beam 80 transports less energy or intensity, respectively, at the edges than in the center thereof. This is expressed by an intensity contribution 86 which is shown dashed on the right-hand side of FIG. 20, the intensity contribution 86 having an approximately parabolic course, wherein the intensity of the intensity contribution 86 is the highest in the center of the illumination field 35 and continuously decreases towards the edge thereof. Thus from a qualitative point of view, the intensity contribution 86 corresponds to the intensity contribution 67 according to FIG. 12.

This qualitative course is also shown schematically in FIG. 16 where it is assigned to channels II and IV. In the representation according to FIG. 16, this parabolic course is approximated by a bent function. Still forming an even function, the second derivative 81 may be transformed such that the expanding effect of the form variation 79 is the highest in the center of the illumination light beam 80 and decreases towards the edges thereof. When the form variation 79 is configured such that the illumination light beam 80 transports more energy in the center than at the edges thereof when seen across its cross-section. Assigned to channels I and III, a corresponding intensity contribution 87 is shown in FIG. 16.

Relative to the incident illumination light beam 8, the channels I to IV are disposed in the four corners of a square.

When the raster module has the form variations 79 according to FIG. 16, the respective illumination effect achieved in the intermediate field plane 18 is shown for three different positions or field points, respectively, a, b, c in FIGS. 17 to 19.

FIG. 17 illustrates the situation at field point a which, according to the representation of FIG. 16, is disposed at the top of the illumination field 35 and approximately in the center of the illumination field 35 when seen in the y-direction perpendicular thereto. This field point a is exposed to an increased intensity when seen from the direction of channels I and III; when seen from the direction of channels II and IV, however, the field point a is exposed to an intensity which is reduced with respect to the basic intensity contribution 85. These deviations from the basic intensity contribution $I_0$ are indicated in FIG. 17 by "+" in the event of a positive deviation and by "−" in the event of a negative deviation. Accordingly, the field point a is exposed to an illumination with an ellipticity that deviates from 1 in a defined manner. Based on the assumption that the intensity of channels I and III amounts to 1.03 $I_0$ while the intensity of channels II and IV amounts to 0.97 $I_0$, an ellipticity E (a) of 6.2% is obtained. Thus, it becomes apparent that the form variation 79 enables considerable ellipticity compensations or ellipticity adjustments to be made as a function of predefined values.

According thereto, field point a is exposed to an intensity-dependent illumination angle distribution in the form of a weak y-dipole. Field point b on the other hand is exposed to the same intensity $I_0$ from the directions of all channels I to IV.

Field point c is exposed to the same intensity-dependent illumination angle distribution as field point a.

FIGS. 21 to 25 show a schematic view of the optical effect of another raster module including a form variation 88 which is shown on the left-hand side of FIG. 25 on the entry side of the second raster element 28. The form variation 88 is hereinafter also referred to as $p_3$ (x). Components and reference values which have already been described above in relation to FIGS. 16 to 20 and 26 are denoted by the same reference numerals and are not described in detail again.

Form variation 88 has a second derivative 89 in the form of a function with an odd portion. The second derivative 89 is shown dotted in FIG. 26. In the form variation 88, the second derivative 89 causes the illumination light beam 80 to be expanded to a greater extent in a beam area shown at the top of FIG. 25 than compared to the beam area shown at the bottom thereof, as can be seen when comparing the rays 83 without form variation 88 to the rays 84 with form variation 88. This expansion effect, which shows an odd behavior in the x-direction, results in an inclined intensity contribution 90 in the illumination field 35 which corresponds to the intensity contribution 38 in FIG. 2, for example. FIGS. 21 to 24 illustrate the field-dependent effect of the raster module 13 including second raster elements 28 having the form variation 88. In the arrangement according to FIG. 21, the channels I to III are disposed at the same height (y=constant).

The form variations 88 of channels I and III are exactly mirror-symmetric to one another with respect to a yz-plane which contains the central ray of the illumination light beam 8. Also shown in FIG. 25, the intensity contribution 90 is achieved by way of the optical effect of the form variation 88 of channel III. Accordingly, the mirror-symmetric design of the form variation 88 of channel I leads to a mirror-symmetric intensity contribution 91 of channel I. Channel II is designed without form variation so that in this case, the basic intensity contribution 85 is obtained.

The field-dependent illumination angle distribution of the arrangement according to FIG. 21 is shown by FIGS. 22 to 24. At the topmost field point a shown in FIG. 21, channel I delivers an intensity which is increased relative to $I_0$ while channel III delivers an intensity which is reduced relative to $I_0$. This is indicated by "+" for channel I and by "−" for channel III. Channel II on the other hand delivers the intensity contribution $I_0$ for all field points a, b, c, which is illustrated by "0" in FIGS. 22 to 24. At the field point b, all channels I to III deliver the same intensity $I_0$. At the field point c, channel I delivers an intensity which is reduced relative to $I_0$ while channel III delivers an intensity which is increased relative to $I_0$.

Thus when seen in the x-direction, the field points near the edge are exposed to the highest amount of intensity when illuminated from the directions passing through the edge of the illumination optics. This may serve for compensation if the transmission of the illumination optics is slightly lower near the edges than across the remaining aperture thereof.

FIG. 27 shows the device with the additional optical effect which is configured as an intensity variation device 92. The intensity variation device 92 includes variation filter elements 93, 94, 95, 96 which are assigned to the first raster elements 23 of the first raster array 12, with the variation filter element 93 being assigned to a channel I, the variation filter element 94 to a channel II, the variation filter element 95 to a channel III and the variation filter element 96 to a channel IV of the illumination light beam 8. The effect of the variation filter elements 93 to 96 is such that after passing through the variation filter elements 93 to 96, the illumination light 8 is subject to an attenuation which is dependent on the point of incidence on these raster elements 23.

The variation filter elements 93 to 96 are configured as reflection filter elements which include a carrier, translucent to the illumination light 8, with particles incorporated therein that are reflective of the illumination light. These particles are metal particles such as chromium particles according to the example of FIG. 27. The particles advantageously have a minimum diameter of 50 μm. Advantageously, the minimum diameter of the particles exceeds 250 times the wavelength of the illumination light.

The point-of-incidence-dependent course of transmission of the variation elements 93 to 96 is defined by a preset number of chromium particles per volume unit of the carrier material. Alternatively or additionally, the course of transmission across incidence surfaces of the variation filter elements 93 to 96 may be defined by way of the particle size. The larger one of the particles, the higher the reflectiveness thereof. The incidence surfaces are formed by the surface areas of the variation filter elements 93 to 96, wherein the surface areas are assigned to the respective channels I to IV.

The point-of-incidence-dependent reflectiveness of the variation filter element 93 is such that channel I in the illumination field 35 delivers an intensity contribution 97 which corresponds—from a qualitative point of view—to the intensity contribution 38 according to FIG. 2. This is achieved by arranging chromium particles in a more and more closely packed manner at the upper edge of the variation filter element 93 according to FIG. 27 or by incorporating chromium particles into the carrier that become larger and larger when seen towards the top.

The variation filter element 94 in channel II shows an arrangement of chromium particles which, compared to the arrangement in the variation filter element 93, is exactly mirror-symmetric with respect to the yz-plane. This results in an intensity contribution 98 of channel II across the illumination field 35 which corresponds to the intensity contribution 37 according to FIG. 2.

The variation filter element 95 delivers a transmission which is constant across the point of incidence, thus resulting in a constant basic intensity contribution 99.

The variation filter element 96 delivers an intensity contribution 100 whose qualitative course corresponds to that of the intensity contribution 98, wherein the intensity contribution 100 shows a higher absolute increase dI/dx.

As far as the field-dependent effect on the intensity contributions is concerned, the arrangement of FIG. 27 is comparable to that of FIG. 2.

The x-dependent courses of transmission T(x) of the variation filter elements 93 to 96 are shown by FIG. 27 in a schematic view on the left-hand side of each of the variation filter elements 93 to 96. In the y-direction, the variation filter elements may show a corresponding dependence on the courses of transmission. Alternatively, the course of transmission of the variation filter elements 93 to 96 may have a qualitatively different dependence on the course of transmission; the transmission of the variation filter elements 93 to 96 may however also be constant in the y-direction.

FIG. 28 shows a raster module 101 which, instead of two raster arrays, includes only one raster array 102 with raster elements 103. The design of the raster array 102 corresponds to that of the first raster array 12 as described above. The raster array 102 is disposed in a pupil plane or adjacent to a pupil plane of the illumination system of FIG. 28. Likewise, the downstream components of the illumination system according to FIG. 28 also correspond to those of the above described embodiments. FIG. 28 shows three channels I, II, III into which the illumination light beam 3 is divided. Just like the embodiments described above, according to FIG. 28 may include a much higher number of raster channels as well.

A respective angle variation portion 104, 105 of an illumination angle variation device 106 is disposed upstream of each raster element 103 of channels I and III. The angle variation portions 104, 105 are configured as wedge plates for deflecting the illumination light beams 107, 108, assigned to channels I and III, towards the illumination light beam 109 assigned to channel II. Due to the optical effect of the raster module 101 and the condenser 17, the deflection by way of the angle variation portions 104, 105 causes the intensity contributions 110, 111 for channels I and III to be displaced in the positive or negative y-direction with respect to an intensity contribution 112 of channel II. The extent of displacement is dependent on the imaging effect of the angle variation portions 104, 105 and on the distance thereof from the raster array 102. The sum total of the intensity contributions 110 to 112 is shown on the right-hand side of FIG. 28. A step function is obtained. The number of steps is dependent on the number of raster elements 103 involved. By using a higher number of angle variation portions with different deflection angles, a trapezoidal function may be obtained instead of a step function.

Shown on the right-hand side of FIG. 28, the intensity diagram shows—by way of a continuous line—a total intensity which is achieved if the angle variation portions 104, 105 do not generate a point-of-incidence-dependent optical effect. If the angle variation portions 104, 105 additionally have a point-of-incidence-dependent effect, as for instance described above in relation to FIG. 4, inclined intensity contributions 110', 111' are achieved which are seen in the step function (shown continuously) on the right-hand side of FIG. 28. Accordingly, the sum total of the two inclined intensity contributions 110', 111', which is shown on the rightmost side of FIG. 28, includes the intensity contribution 112.

Provided that they are assigned to individual raster elements on a 1:1 basis, the above described various embodiments of devices with additional optical effects are applicable for individual raster elements 23, 28, for a plurality of raster elements 23, 28 which are in particular disposed in connected areas of the raster module 13, or for all raster elements 23, 28.

The optically active surfaces of the raster elements 28 including the respective form variation 79, 88 may in particular be configured as freeform surfaces. The freeform surfaces are in particular configured such that they are not described by a rotationally symmetric function, such as a spherical function or an aspherical function, but are such that they are rotationally symmetric.

The invention claimed is:

1. A system configured to illuminate an illumination field with light, the system comprising:
   a raster array comprising raster elements arranged in raster lines and raster columns, the raster array being in or adjacent to a first plane, the raster array being configured to receive light and to generate a raster array of secondary light sources; and
   transmission optics configured to superimpose and guide the secondary light sources into the illumination field, wherein:
      the raster elements have an entry surface and an exit surface;
      an axis is defined by a center of the entry surface and a center of the exit surface;
      the raster elements have an entry side with a form variation configured so that the entry surface is not rotationally symmetric with respect to the axis, and/or the raster elements have an exit side with a form variation configured so that the exit surface is not rotationally symmetric with respect to the axis;
      the form variation is configured so that a second derivative of the form variation results in an even function; and
      the system is a microlithographic illumination system.

2. The system of claim 1, wherein the entry side of the raster elements has a form variation configured so that the entry surface is not rotationally symmetric with respect to the axis.

3. The system of claim 2, wherein the exit side of the raster elements has a form variation configured so that the exit surface is not rotationally symmetric with respect to the axis.

4. The system of claim 1, wherein the exit side of the raster elements has a form variation configured so that the exit surface is not rotationally symmetric with respect to the axis.

5. The system of claim 1, wherein the entry surface is inclined with respect to the axis.

6. The system of claim 1, wherein the form variation is configured to influence at least one property of the light selected from the group consisting of an intensity of the light, a phase of the light, and a beam direction of the light.

7. The system of claim 6, further comprising a device configured so that the device has an influence on the at least one property of the light in the vicinity of the raster array, wherein the system is configured so that:
   the influence is transformed into an illumination field-dependent total intensity distribution by the transmission optics; and
   different illumination field points are exposed to different intensity contributions from different directions of the light.

8. The system of claim 7, wherein the device is a diffractive device.

9. The system of claim 7, wherein the device is a refractive device.

10. The system of claim 6, further comprising a device configured so that the device has an influence on the at least one property of the light in the vicinity of the raster array, wherein the system is configured so that:
    the influence is transformed into an illumination field-dependent total intensity distribution by the transmission optics; and
    different illumination field points are exposed to equal intensity contributions from different directions of the light.

11. The system of claim 10, wherein the device is a diffractive device.

12. The system of claim 10, wherein the device is a refractive device.

13. The system of claim 6, further comprising a device configured so that the device has an influence on the at least one property of the light in the area of the raster array, wherein the system is configured so that:
    the influence is transformed into an illumination field-dependent total intensity distribution by the transmission optics; and
    different illumination field points are exposed to different intensity contributions from different directions of the light.

14. The system of claim 13, wherein the device is a diffractive device.

15. The system of claim 13, wherein the device is a refractive device.

16. The system of claim 1, wherein the form variation is configured so that that an intensity contribution of the raster elements to a total illumination intensity varies across the illumination field.

17. The system of claim 1, wherein individual raster elements are wedge elements.

18. The system of claim 1, further comprising a light distribution device configured to generate a two-dimensional intensity distribution in the first plane, wherein the first plane is perpendicular to an optical axis of the system.

19. The system of claim 1, wherein the raster array comprises:
    a line array comprising the raster lines; and
    a column array comprising the raster columns.

20. The system of claim 1, wherein the form variation is configured so that, after passing through the raster elements, the light is subject to a deflection angle distribution which is dependent on a point of incidence on the raster elements.

21. The system of claim 20, wherein the raster elements have optically active surfaces with the form variation, and the optically active surfaces are configured as freeform surfaces.

22. The system of claim 1, wherein the raster elements have optically active surfaces with the form variation, and the optically active surfaces are configured as freeform surfaces.

23. The system of claim 1, further comprising a device spatially adjacent to the first raster array or in a plane which is optically conjugate with a plane in which the first raster array is disposed, wherein the device influences at least one property of the light selected form from the group consisting of an intensity of the light, a phase of the light, and a beam direction of the light.

24. An apparatus, comprising:
    an illumination system configured to illuminate an illumination field with light, the system comprising:
      a raster array comprising raster elements arranged in raster lines and raster columns, the raster array being in or adjacent to a first plane, the raster array being configured to receive light and to generate a raster array of secondary light sources; and transmission optics configured to superimpose and guide the secondary light sources into the illumination field; and a projection objective configured to project the light from the illumination field to an image field, wherein:
the raster elements have an entry surface and an exit surface;
an axis is defined by a center of the entry surface and a center of the exit surface;
the raster elements have an entry side with a form variation configured so that the entry surface is not rotationally symmetric with respect to the axis, and/or the raster elements have an exit side with a form variation configured so that the exit surface is not rotationally symmetric with respect to the axis;
the form variation is configured so that a second derivative of the form variation results in an even function; and
the apparatus is a microlithographic projection exposure apparatus.

25. A method, comprising:
using a microlithographic projection exposure apparatus, which comprises:
an illumination system configured to illuminate a reticle in an illumination field with light, the system comprising:
a raster array comprising raster elements arranged in raster lines and raster columns, the raster array being in or adjacent to a first plane, the raster array being configured to receive light and to generate a raster array of secondary light sources; and
transmission optics configured to superimpose and guide the secondary light sources into the illumination field; and
a projection objective configured to project at least a portion of reticle from the illumination field to a light-sensitive material in an image field, wherein:
the raster elements have an entry surface and an exit surface;
an axis is defined by a center of the entry surface and a center of the exit surface;
the raster elements have an entry side with a form variation configured so that the entry surface is not rotationally symmetric with respect to the axis, and/or the raster elements have an exit side with a form variation configured so that the exit surface is not rotationally symmetric with respect to the axis; and
the form variation is configured so that a second derivative of the form variation results in an even function.

* * * * *